United States Patent
Yu et al.

(10) Patent No.: US 9,773,768 B2
(45) Date of Patent: Sep. 26, 2017

(54) METHOD AND STRUCTURE OF THREE-DIMENSIONAL CHIP STACKING

(71) Applicant: Taiwan Semiconductor Manufacturing Company, Ltd., Hsin-Chu (TW)

(72) Inventors: Chen-Hua Yu, Hsin-Chu (TW); Wen-Chih Chiou, Hsin-Chu (TW); Yung-Chi Lin, Hsin-Chu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 0 days.

(21) Appl. No.: 14/951,813

(22) Filed: Nov. 25, 2015

(65) Prior Publication Data

US 2017/0103973 A1 Apr. 13, 2017

Related U.S. Application Data

(60) Provisional application No. 62/239,628, filed on Oct. 9, 2015.

(51) Int. Cl.

| H01L 21/00 | (2006.01) |
|---|---|
| H01L 25/00 | (2006.01) |
| H01L 25/065 | (2006.01) |
| H01L 21/56 | (2006.01) |
| H01L 21/48 | (2006.01) |
| H01L 23/31 | (2006.01) |
| H01L 23/498 | (2006.01) |

(52) U.S. Cl.
CPC ............ *H01L 25/50* (2013.01); *H01L 21/486* (2013.01); *H01L 21/4853* (2013.01); *H01L 21/56* (2013.01); *H01L 23/3157* (2013.01); *H01L 23/49827* (2013.01); *H01L 25/0652* (2013.01)

(58) Field of Classification Search
CPC ........... H01L 21/76805; H01L 27/0756; H01L 25/0657; H01L 25/043; H01L 25/0756; H01L 2924/19
USPC ........................................... 257/758; 438/108
See application file for complete search history.

(56) References Cited

U.S. PATENT DOCUMENTS

| 5,385,632 | A | 1/1995 | Goossen |
| 7,838,424 | B2 | 11/2010 | Karta et al. |
| 7,863,742 | B2 | 1/2011 | Yu et al. |
| 7,932,601 | B2 | 4/2011 | Chang et al. |
| 8,563,403 | B1 * | 10/2013 | Farooq .................. H01L 24/80 |
| | | | 257/E21.597 |

(Continued)

FOREIGN PATENT DOCUMENTS

| EP | 1154474 A1 | 11/2001 |
| KR | 101519307 B1 | 5/2015 |

*Primary Examiner* — Telly Green
(74) *Attorney, Agent, or Firm* — Slater Matsil, LLP

(57) ABSTRACT

A method includes placing a first plurality of device dies over a first carrier, with the first plurality of device dies and the first carrier in combination forming a first composite wafer. The first composite wafer is bonded to a second wafer, and the first plurality of device dies is bonded to a second plurality of device dies in the second wafer through hybrid bonding. The method further includes de-bonding the first carrier from the first plurality of device dies, encapsulating the first plurality of device dies in an encapsulating material, and forming an interconnect structure over the first plurality of device dies and the encapsulating material.

20 Claims, 48 Drawing Sheets

(56) References Cited

U.S. PATENT DOCUMENTS

| | | |
|---|---|---|
| 8,772,151 B2 | 7/2014 | Chen |
| 8,846,548 B2 | 9/2014 | Tu et al. |
| 9,536,679 B2 * | 1/2017 | Chiem .................. H01G 11/86 |
| 2008/0169546 A1 * | 7/2008 | Kwon .................. H01L 21/561 |
| | | 257/686 |
| 2011/0204505 A1 | 8/2011 | Pagaila et al. |
| 2012/0309130 A1 | 12/2012 | Hin et al. |
| 2013/0341800 A1 | 12/2013 | Tu et al. |
| 2014/0001645 A1 | 1/2014 | Lin et al. |
| 2014/0015122 A1 | 1/2014 | Chou et al. |
| 2014/0045379 A1 | 2/2014 | Chen |
| 2014/0048926 A1 | 2/2014 | Wang et al. |
| 2014/0077356 A1 | 3/2014 | Chen et al. |
| 2014/0103411 A1 * | 4/2014 | Dai .................. H01L 27/14609 |
| | | 257/292 |
| 2014/0183693 A1 | 7/2014 | Tsai et al. |
| 2014/0187103 A1 | 7/2014 | Chen et al. |
| 2014/0252558 A1 | 9/2014 | Yu et al. |
| 2014/0252597 A1 | 9/2014 | Tsai et al. |
| 2014/0252601 A1 | 9/2014 | Lu et al. |
| 2014/0252608 A1 | 9/2014 | Chen et al. |
| 2014/0262468 A1 | 9/2014 | Chen et al. |
| 2014/0264885 A1 | 9/2014 | Tsai et al. |
| 2015/0091193 A1 * | 4/2015 | Chen .................... H01L 21/563 |
| | | 257/778 |
| 2015/0108644 A1 * | 4/2015 | Kuang .................. H01L 24/06 |
| | | 257/751 |
| 2015/0235949 A1 | 8/2015 | Yu et al. |
| 2016/0049385 A1 | 2/2016 | Yu et al. |
| 2016/0196932 A1 * | 7/2016 | Chiem .................. H01G 11/86 |
| | | 361/502 |

* cited by examiner

METHOD AND STRUCTURE OF THREE-DIMENSIONAL CHIP STACKING

PRIORITY CLAIM AND CROSS-REFERENCE

This application claims the benefit of the following provisionally filed U.S. Patent Application Ser. No. 62/239,628, filed Oct. 9, 2015, and entitled "Method & Structure of 3D Chip Stacking," which application is hereby incorporated herein by reference.

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, the improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and length of interconnections between devices as the number of devices increases. When the number and length of interconnections increase, both circuit RC delay and power consumption increase.

Three-dimensional (3D) integrated circuits (ICs) were therefore explored to resolve the above-discussed limitations. In a typical formation process of 3DIC, two wafers or dies, each including some integrated circuits, are formed, and are then bonded together. The bonding typically includes using solder to bond the nickel layers that are formed on copper bumps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
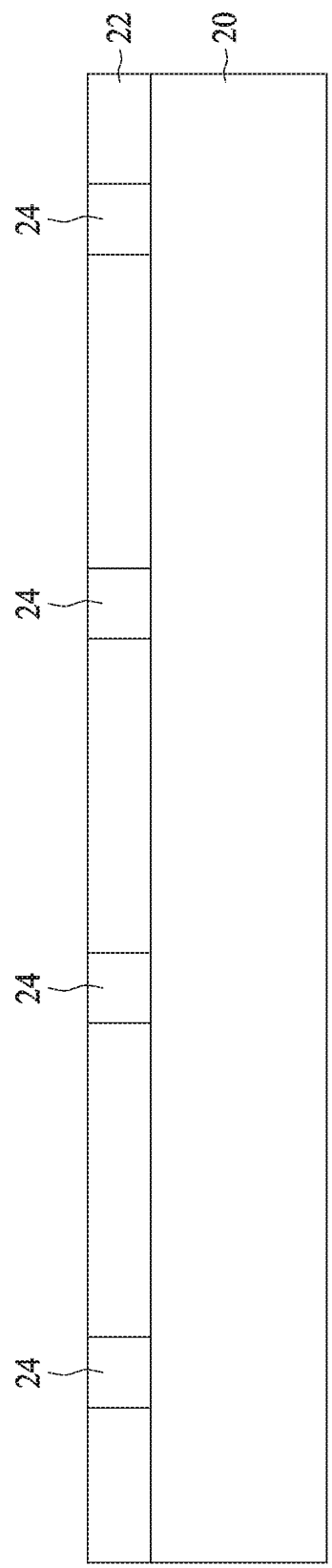
FIGS. 1 through 9 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including a die stack and the method of forming the package at wafer level are provided in accordance with various exemplary embodiments. The intermediate stages of forming some packages are illustrated. Some variations of some embodiments are discussed. Throughout the various views and illustrative embodiments, like reference numbers are used to designate like elements.

Figure 48:
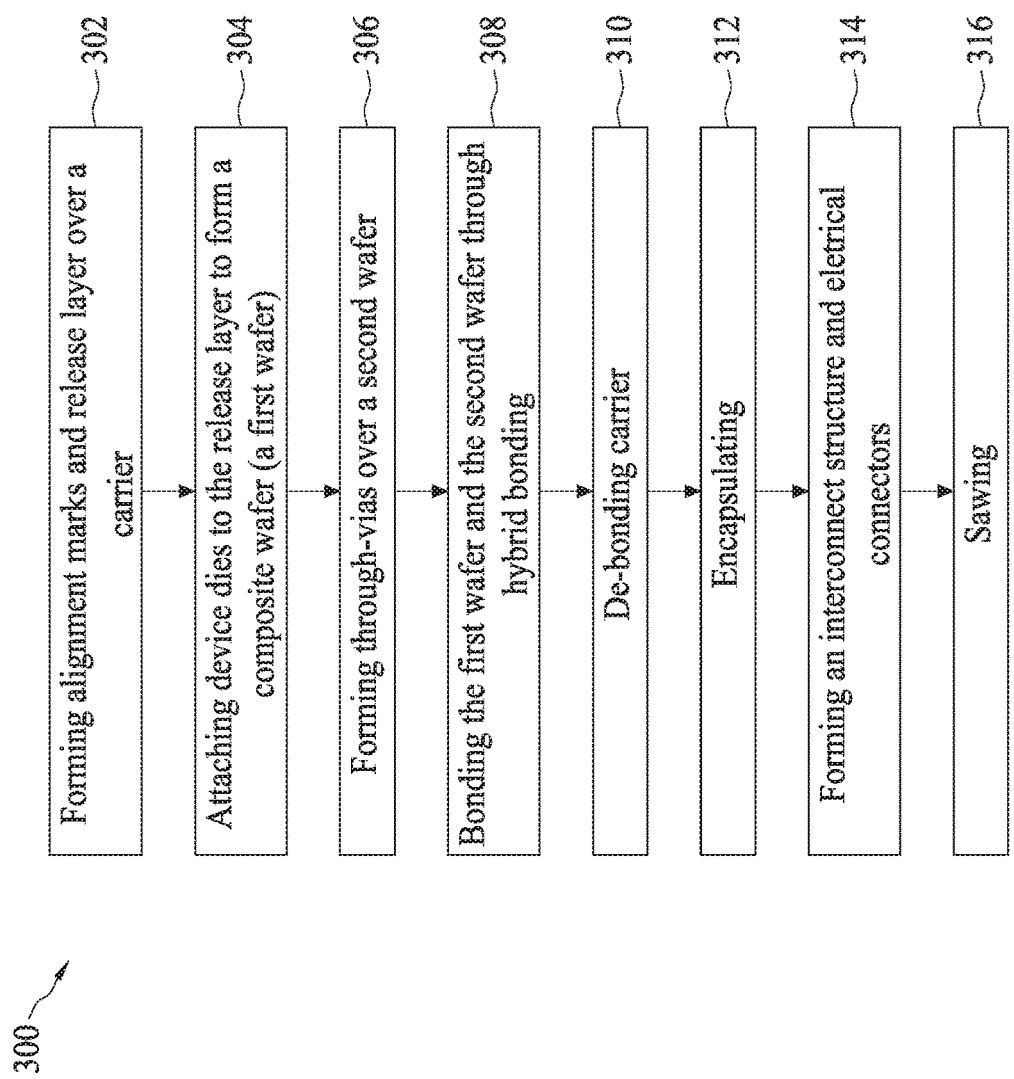
FIG. 48 illustrates a process flow for forming a package in accordance with some embodiments.

FIGS. 1 through 9 illustrate the cross-sectional views of intermediate stages in the formation of a package in accordance with some embodiments. The steps shown in FIGS. 1 through 9 are also illustrated schematically in the process flow 300 shown in FIG. 48.

Figure 2:
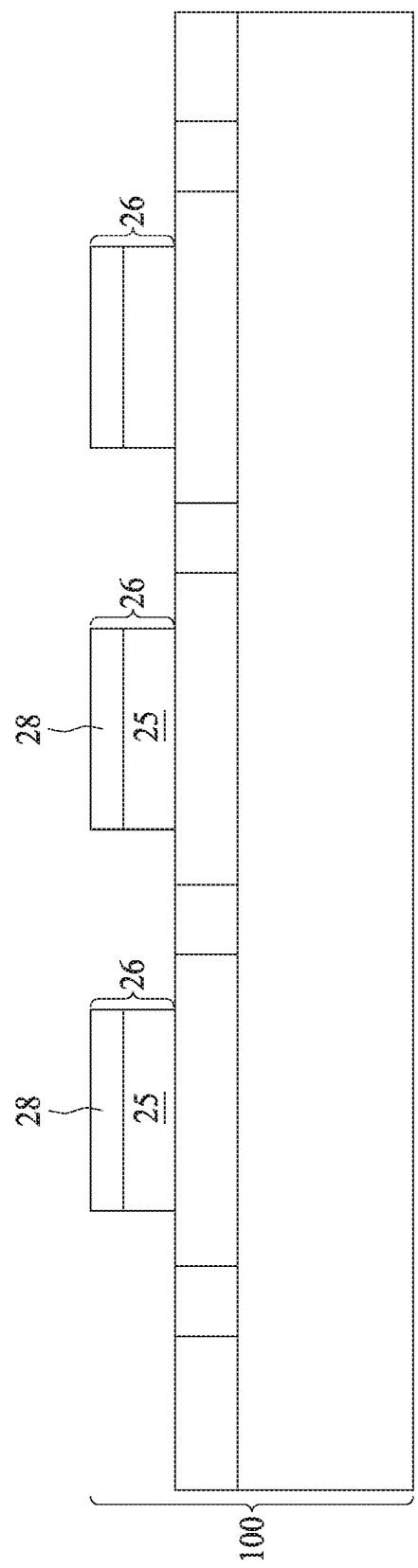

FIGS. 1 and 2 illustrate the formation of a composite wafer in accordance with some embodiments. Referring to FIG. 1, carrier 20 is provided, and release layer 22 is formed on carrier 20. Carrier 20 may be a blanket carrier wafer, which may be a glass carrier, a ceramic carrier, an organic carrier, or the like. Carrier 20 may have a round top-view shape and may have a top-view size of a silicon wafer. For example, carrier 20 may have an 8-inch diameter, a 12-inch diameter, or the like. Release layer 22 may be formed of a polymer-based material (such as a Light To Heat Conversion (LTHC) material), which may be de-composed under the heat of a high-energy light. In accordance with some embodiments of the present disclosure, release layer 22 is formed of an epoxy-based thermal-release material. Release layer 22 may be dispensed as a liquid and cured. In accordance with alternative embodiments, release layer 22 is a laminate film and is laminated onto carrier 20. The top surface of release layer 22 is leveled and has a high degree of co-planarity. Alignment marks 24 are formed. The respective step is shown as step 302 in the process flow shown in FIG. 48. In accordance with some embodiments, alignment marks 24 are formed by forming openings in release layer 22, for example, using laser or a lithography process.

FIG. 2 illustrates the placement of device dies 26. The respective step is shown as step 304 in the process flow shown in FIG. 48. Device dies 26 may be adhered to release layer 22 through Die-Attach films (not shown), which are adhesive films. Device dies 26 may be logic device dies including logic transistors therein, memory device dies, or the like. The positions of device dies 26 are determined based on alignment marks 24, so that each device die 26 has the same relative shift from the respective alignment mark 24. Throughout the description, the combined structure including device dies 26 and carrier 20 is referred to as composite wafer 100.

Figure 44:
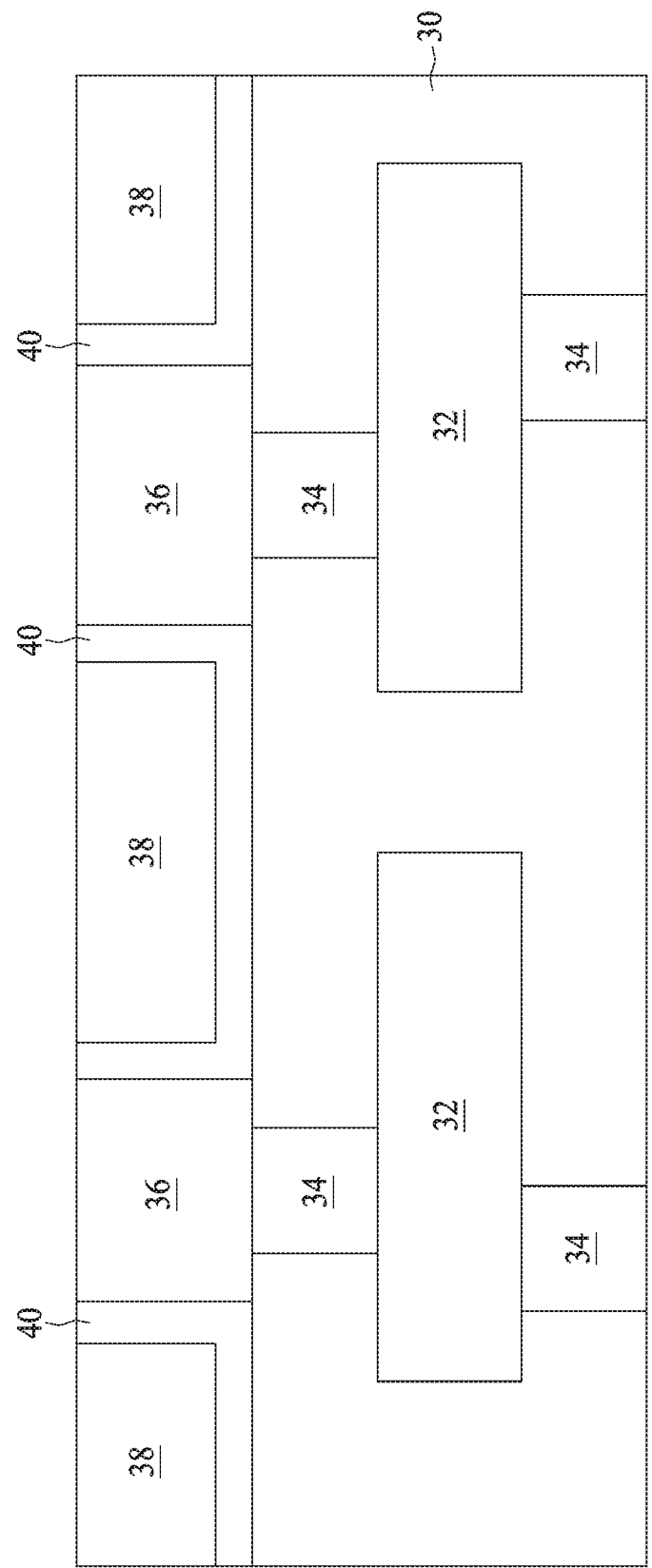
FIG. 44 illustrates a part of an exemplary interconnect structure in accordance with some embodiments.

Device dies 26 are known-good-dies that have passed functional test. Each of device dies 26 includes semiconductor substrate 25, active devices (not shown), and interconnect structure 28. An exemplary interconnect structure 28 is schematically illustrated in FIG. 44. In accordance with some embodiments, interconnect structure 28 includes dielectric layers 30, and metal lines 32 and vias 34 in dielectric layers 30. At the surface of interconnect structure 28 may reside bond pads 36 in surface dielectric layer 38. Bond pads 36 may be copper-containing pads. Surface dielectric layer 38 may be a silicon-containing dielectric layer, which may include silicon oxide. In addition, there may (or may not) exist dielectric liners 40 encircling bond pads 36. The top surfaces of bond pads 36 and surface dielectric layer 38 are coplanar with each other. The top ends of dielectric liners 40 may be coplanar with the top surfaces of bond pads 36, or may be recessed.

Figure 3:
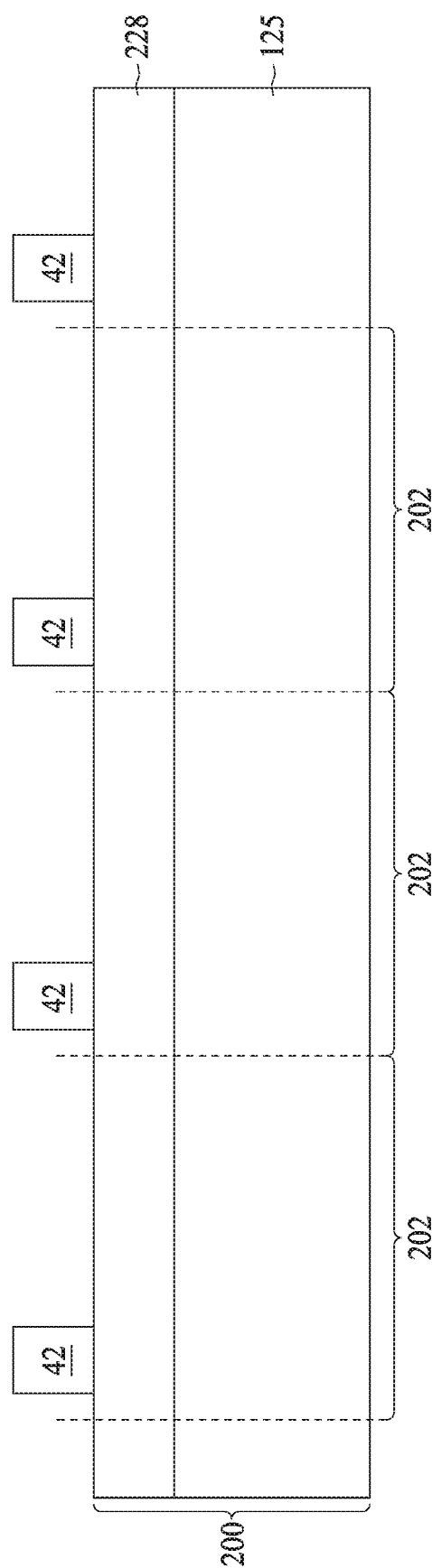

Referring to FIG. 3, wafer 200 is provided. Wafer 200 includes a plurality of identical chips 202 therein. Wafer 200 also includes semiconductor substrate 125, active devices (not shown), and interconnect structure 228. Chips 202 may also be logic chips, memory chips, IO chips, or the like. Interconnect structure 228 may have the similar structure shown in FIG. 44, which may also include dielectric layers, metal lines, vias, bond pads, and a surface dielectric layer. On the top surface of wafer 200, conductive vias 42, which have the shape of conductive posts, are formed. Conductive vias 42 are referred to as through-vias since they penetrate through the subsequently formed encapsulating material. The respective step is shown as step 306 in the process flow shown in FIG. 48. Although one through-via 42 is illustrated as overlapping each of device dies 202, there may be a plurality of through-vias 42 overlapping each device die 202. The height of through-vias 42 is smaller than the height of devices dies 26 in FIG. 2. Conductive vias 42 are formed starting from the metal pads 54 (not shown in FIG. 3, refer to FIG. 9) at the surface of device dies 202. The metal pads may be coplanar with, and may be formed simultaneously as, bond pads 236 (not shown in FIG. 3, refer to FIG. 9) in device dies 202. The formation of conductive vias 42 may include forming a photo resist (not shown) on wafer 200, patterning the photo resist to expose portions of the metal pads, plating through-vias 42, and removing the photo resist.

Figure 4:
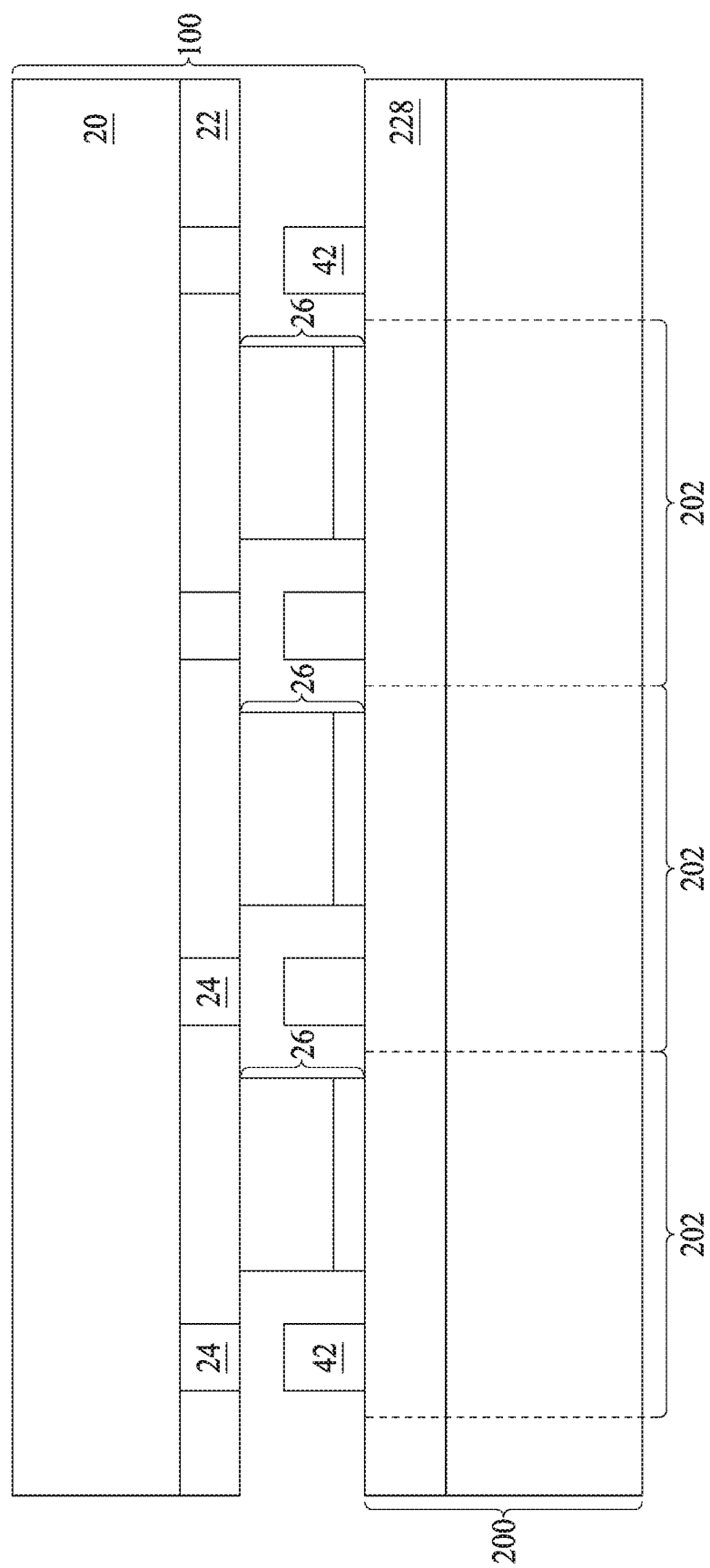
Figure 45:
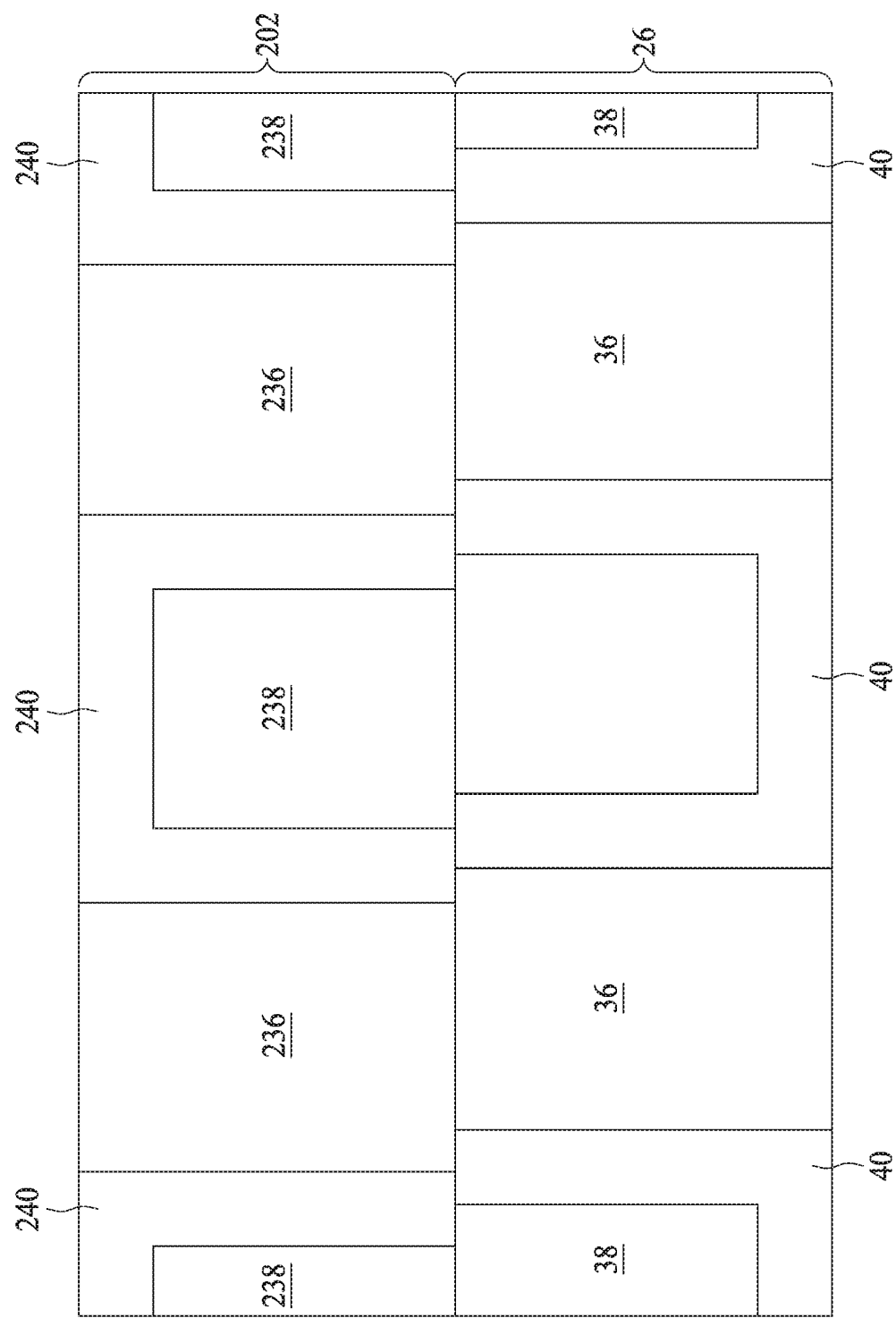
FIGS. 45 through 47 illustrate the cross-sectional views of some portions of hybrid bonding in accordance with some embodiments.

Next, referring to FIG. 4, composite wafer 100 and wafer 200 are bonded to each other through hybrid bonding, which is a wafer level bonding. The respective step is shown as step 308 in the process flow shown in FIG. 48. Composite wafer 100 and wafer 200 are aligned to each other, for example, by aligning alignment marks 24 to through-vias 42. When wafer 100 and 200 are aligned, alignment marks 24 may overlap corresponding through-vias 42. FIG. 45 illustrates an amplified view of a portion of the hybrid bonding between device die 202 and device die 26. As shown in FIG. 45, device die 202 includes bond pads 236 in device die 202 bonded to bond pads 36 in device die 26 through direct metal-to-metal bonding. Surface dielectric layer 238 in device die 202 is bonded to surface dielectric layer 38 in device die 26 through fusion (oxide-to-oxide) bonding.

Referring back to FIG. 4, the hybrid bonding includes a pre-bonding step, during which composite wafer 100 is put to contact with wafer 200. Next, an anneal is performed, for example, at a temperature between about 200° C. and about 300° C. for a duration between about 1.5 hours and about 2.5 hours, so that the copper in bond pads 36 and 236 (FIG. 45) inter-diffuses to each other, and hence the direct metal-to-metal bonding is formed.

Differing from conventional wafer-to-wafer hybrid bonding, there is a plurality of spaces in the resulting bonded structure, wherein the spaces are between device dies 26 of composite wafer 100. This eliminates the requirement for performing the wafer-level hybrid bonding in a vacuum environment since air bubble is unlikely to be trapped between wafers 100 and 200. As a comparison, in the conventional wafer-to-wafer hybrid bonding, there is no space between the device dies in the bonded wafers.

Figure 5:
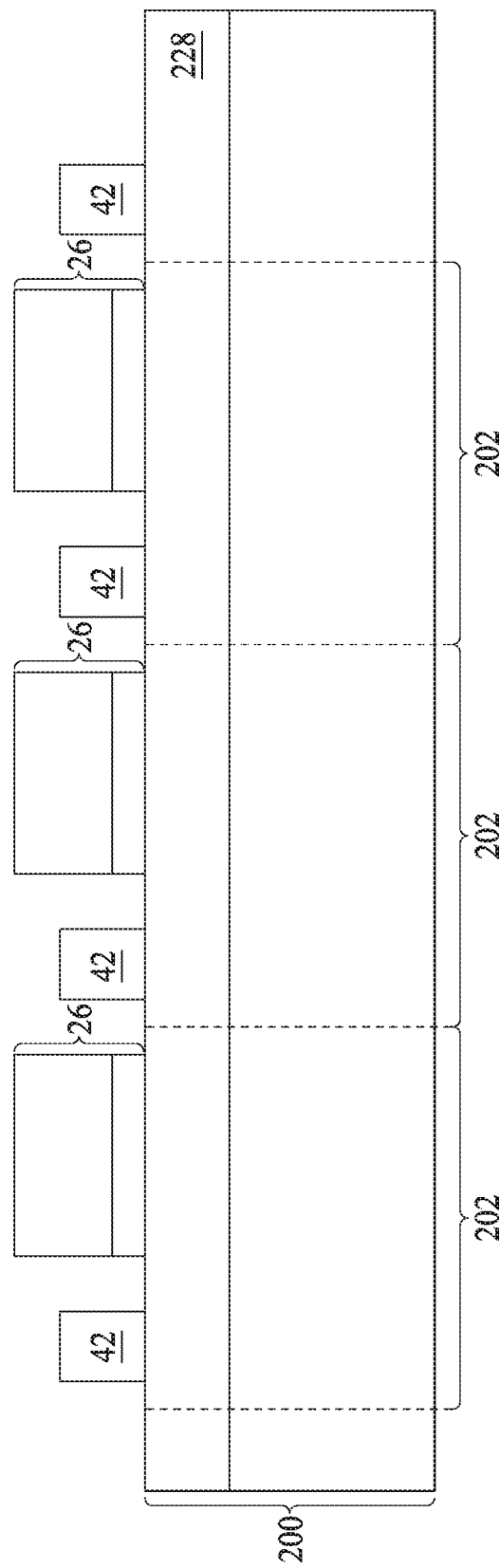

Next, carrier 20 is de-bonded. The respective step is shown as step 310 in the process flow shown in FIG. 48. In accordance with some exemplary embodiments, the de-bonding includes projecting a light (such as laser) on release layer 22 to decompose release layer 22. In accordance with alternative embodiments, the de-bonding is performed by submerge the structure in FIG. 4 into a chemical solution that may dissolve release layer 22. Since there are spaces between wafers 100 and 200, the chemical solution is able to reach the inner portions of release layer 22 close to the center of wafer 100, and hence release layer 22 may be fully dissolved. As a result of the de-bonding of carrier 20, composite wafer 100 is separated into discrete device dies 26, each bonded to wafer 200 through hybrid bonding, as illustrated in FIG. 5.

In accordance with some exemplary embodiments, both the pre-bonding and the annealing are performed before the de-bonding of carrier 20. In accordance with alternative embodiments, the annealing is performed after the de-bonding. Accordingly, the pre-bonding is performed at wafer-to-wafer level, while the annealing is performed at die-to-wafer level. Advantageously, by performing annealing after the de-bonding, the materials of release layer 22 may adopt the materials that cannot endure the temperature for annealing.

Figure 6:
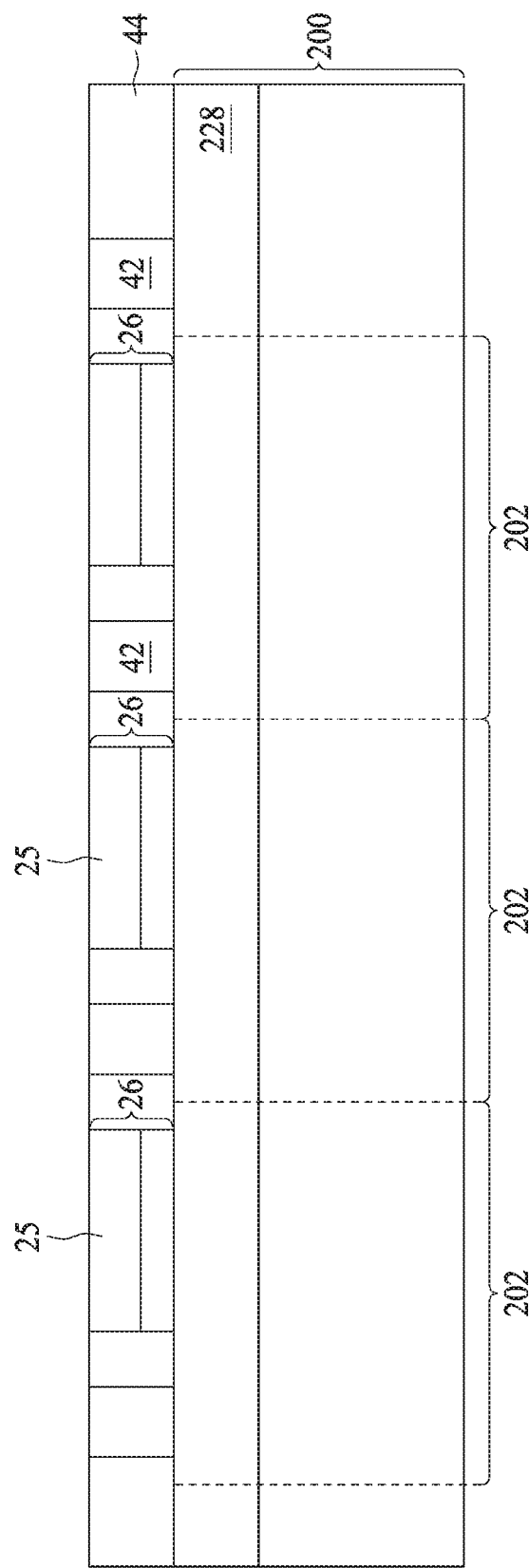

Next, as shown in FIG. 6, encapsulating material 44 is encapsulated (molded) on device dies 26. The respective step is shown as step 312 in the process flow shown in FIG. 48. Encapsulating material 44 fills the gaps between neighboring device dies 26 and through-vias 42. Encapsulating material 44 may include a molding compound, a molding underfill, an epoxy, or a resin. In accordance with some embodiments, the top surface of encapsulating material 44 is higher than the top surfaces of through-vias 42 and the top surfaces of device dies 26 (which are the surfaces of the semiconductor substrates 25). A planarization step (such as Chemical Mechanical Polish (CMP)) is then performed to remove excess encapsulating material 44, so that semiconductor substrates 25 and through-vias 42 are exposed. Furthermore, in the planarization, semiconductor substrate 25 may also be thinned, for example, to a thickness in the range between about 2 μm and about 10 μm.

Figure 7:
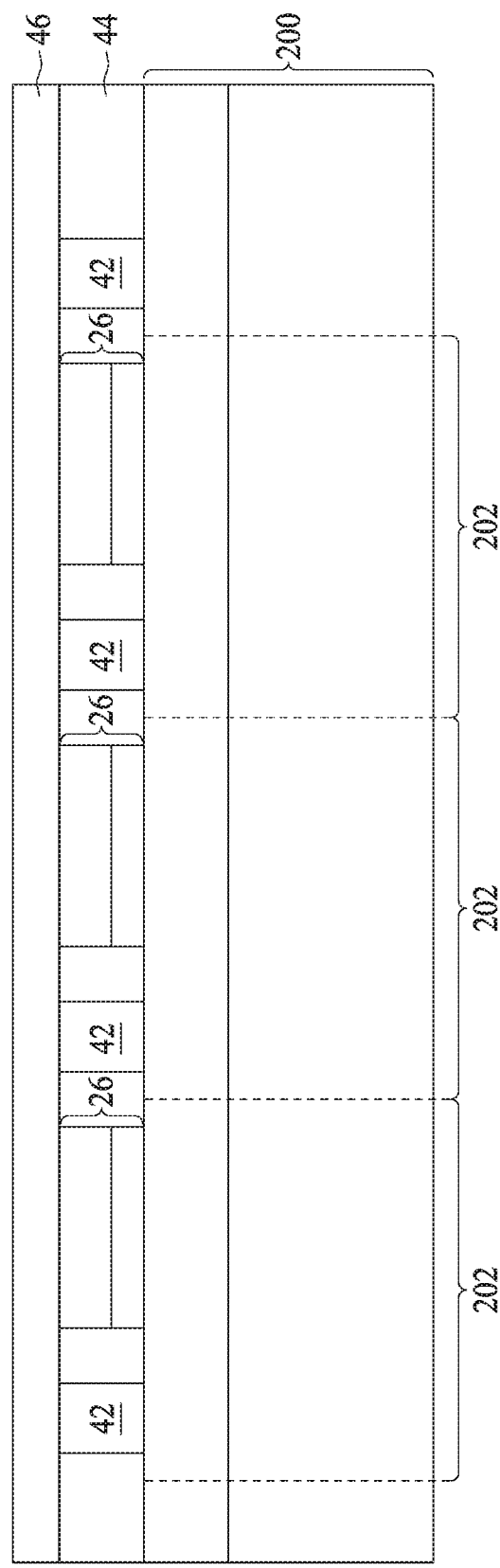
Figure 37:
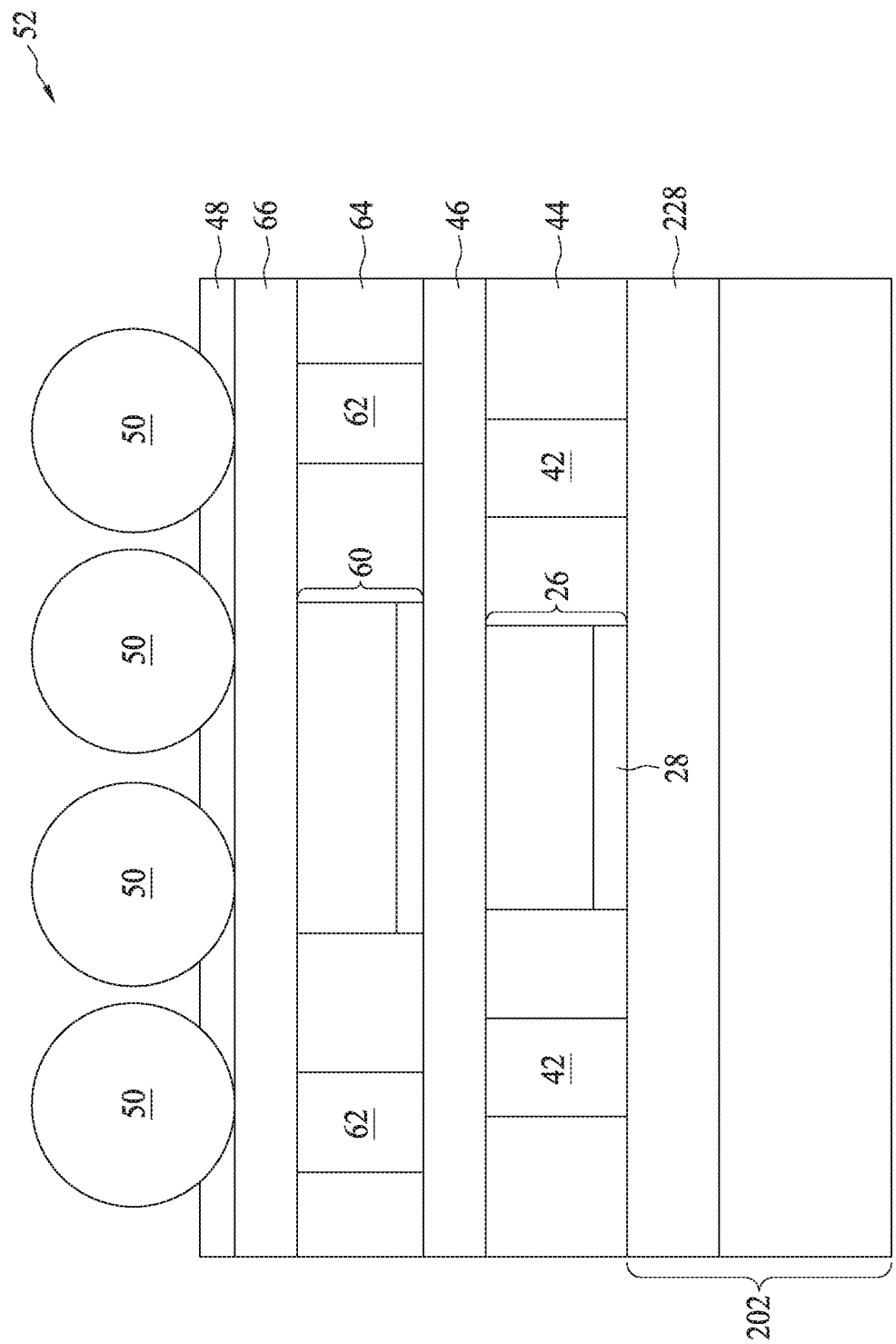

Next, referring to FIG. 7, interconnect structure 46 is formed. The respective step is shown as step 314 in the process flow shown in FIG. 48. Interconnect structure 46 may have a structure similar to the structure as shown in FIG. 44, and includes dielectric layers and Redistribution Lines (RDLs) in the dielectric layers. The RDLs are electrically connected to through-vias 42. The RDLs also include metal line portions and via portions, similar to what is shown in FIG. 44. In accordance with some embodiments of the present disclosure, interconnect structure 46 includes surface bond pads and surface dielectric layers having top surfaces coplanar with each other, which is essentially the same as in FIG. 44. These embodiments may be adopted when more device dies are to be bonded to interconnect structure 46, as shown in FIG. 37. In accordance with alternative embodiments, interconnect structure 46 does not have a planar top surface.

In accordance with some embodiments of the present disclosure, the RDLs in interconnect structure 46 are formed through plating. In accordance with alternative embodiments, the RDLs are formed using damascene processes.

Figure 8:
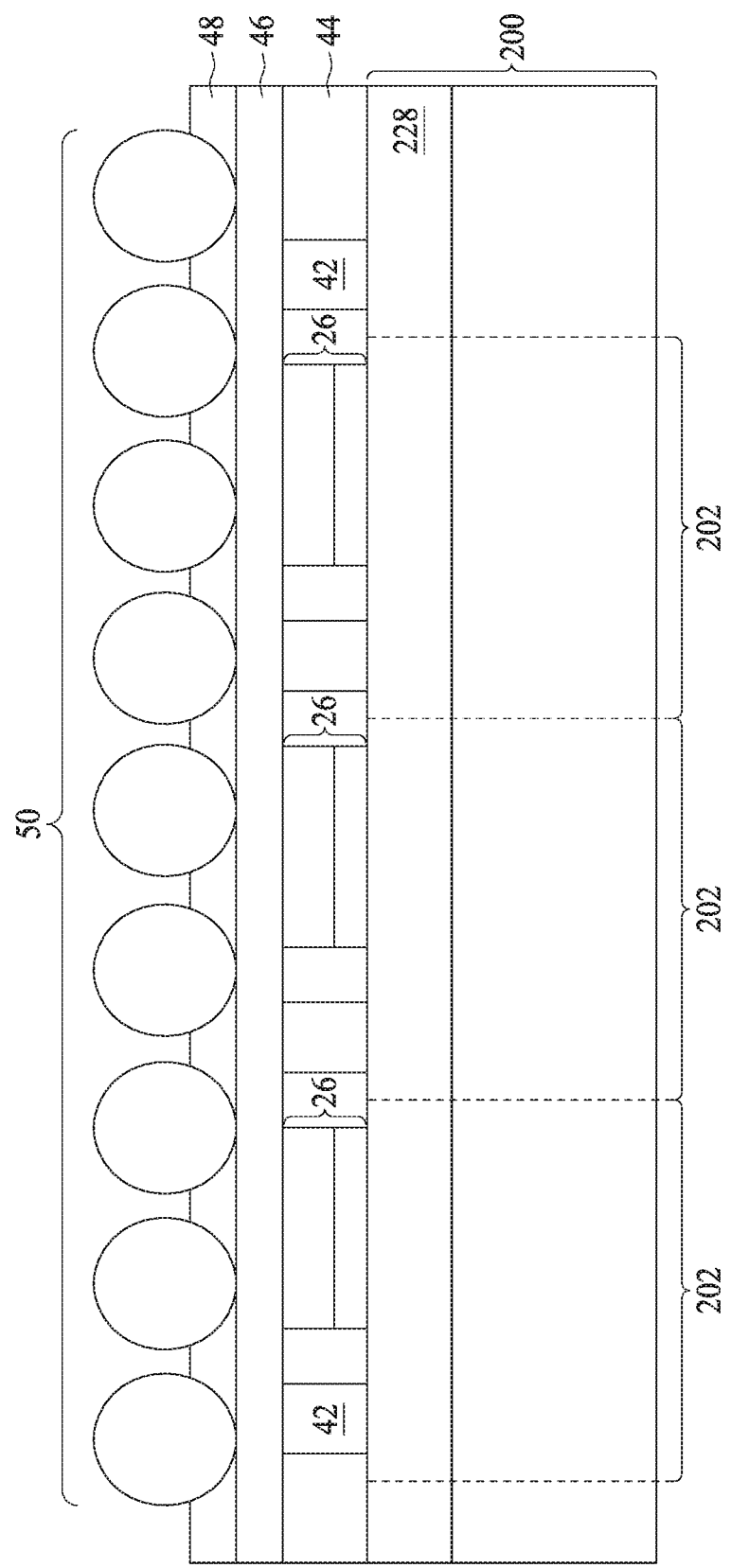

Referring to FIG. 8, dielectric layer 48 is formed over interconnect structure 46. Dielectric layer 48 may be formed using a polymer, which may include polybenzoxazole (PBO), polyimide, benzocyclobutene (BCB), or the like.

FIG. 8 also illustrates the formation of electrical connectors 50 that are electrically coupled to the RDLs in interconnect structure 46 and through-vias 42. The respective step is also shown as step 314 in the process flow shown in FIG. 48. Electrical connectors 50 may include Under-Bump Metallurgies (UBMs, not shown) and solder regions in accordance with some exemplary embodiments. The formation of the UBMs may include deposition and patterning. Solder balls may be placed on the UBMs, and are then reflowed. In accordance with alternative embodiments, the formation of electrical connectors 50 includes performing a plating step to form solder regions over the RDLs and then reflowing the solder regions. Electrical connectors 50 may also include metal pillars, and possibly solder caps, which may also be formed through plating.

Figure 9:
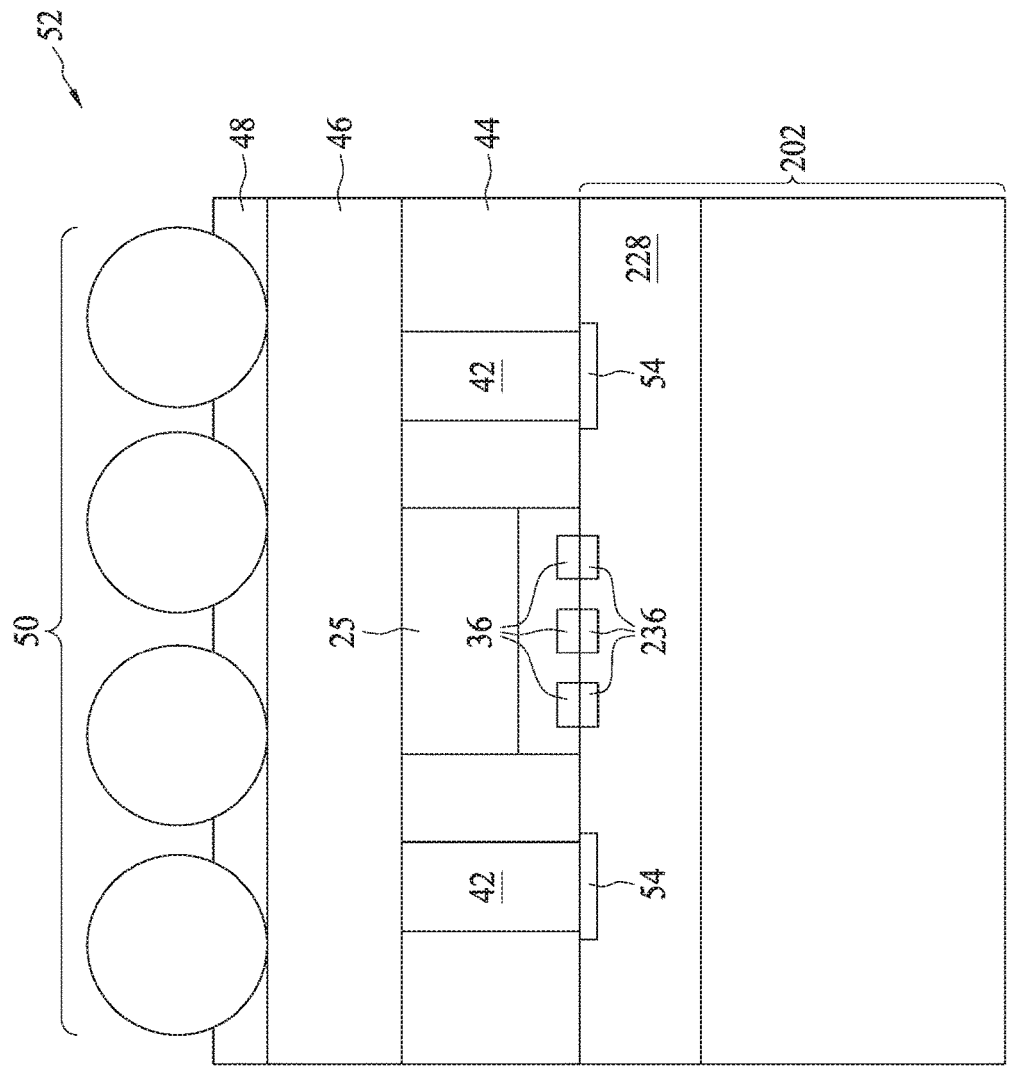

The structure shown in FIG. 8 is then sawed into individual packages, wherein FIG. 9 illustrates one of packages 52. The respective step is shown as step 316 in the process flow shown in FIG. 48. Package 52 includes a larger device die 202, which extends all the way to the edges of package 52. Smaller device die 26, which has smaller lateral dimensions and a smaller top-view area than device die 202, is bonded to larger device die 202 through hybrid bonding. Through-vias 42 may be formed directly from metal pads 54, and penetrates through encapsulating material 44. Encapsulating material 44 further encircles device die 26 and through-vias 42.

FIGS. 10 through 17 illustrate cross-sectional views of intermediate stages in the formation of a package in accordance with some embodiments of the present disclosure. Unless specified otherwise, the materials and the formation methods of the components in these embodiments are essentially the same as the like components, which are denoted by like reference numerals in the embodiments shown in FIGS. 1 through 9. The details regarding the formation process and the materials of the components shown in FIGS. 10 through 17 (and FIGS. 18 through 35) may thus be found in the discussion of the embodiments shown in FIGS. 1 through 9.

Figure 10:
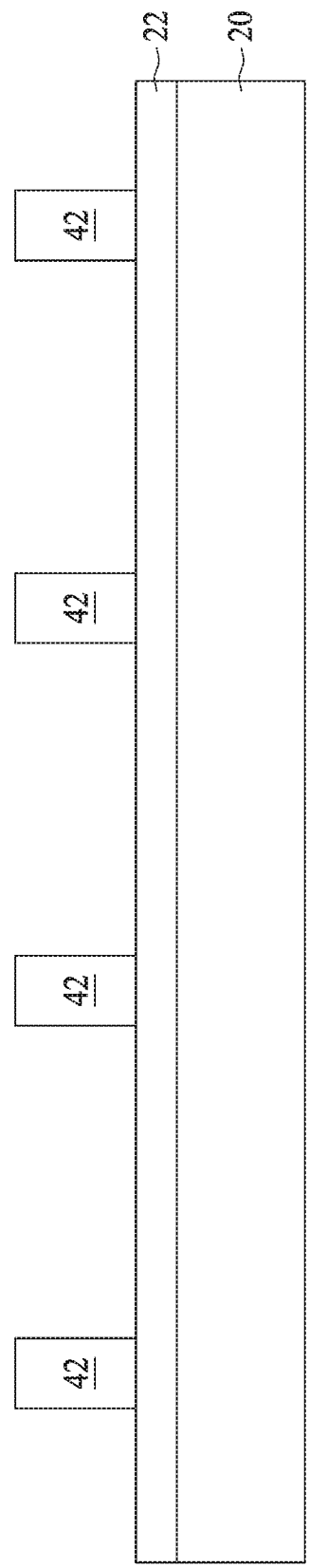
FIGS. 10 through 17 illustrate the cross-sectional views of intermediate stages in the formation of a package in accordance with some embodiments.

The embodiments shown in FIGS. 10 through 17 are similar to the embodiments in FIGS. 1 through 9, except that through-vias are first formed on the composite wafer. Referring to FIG. 10, through-vias 42 are formed over release layer 22, which is further located over carrier 20. In accordance with some embodiments of the present disclosure, an additional polymer layer such as PBO (not shown) may be formed over release layer 22. The formation of conductive vias 42 may include forming a blanket seed layer (such as a titanium layer and a copper layer over the titanium layer) over the additional polymer layer, forming a photo resist (not shown) over the seed layer, patterning the photo resist to expose some portions of the seed layer, plating through-vias 42, removing the photo resist, and performing an etch to remove the portions of the seed layer previously covered by the photo resist.

Figure 11:
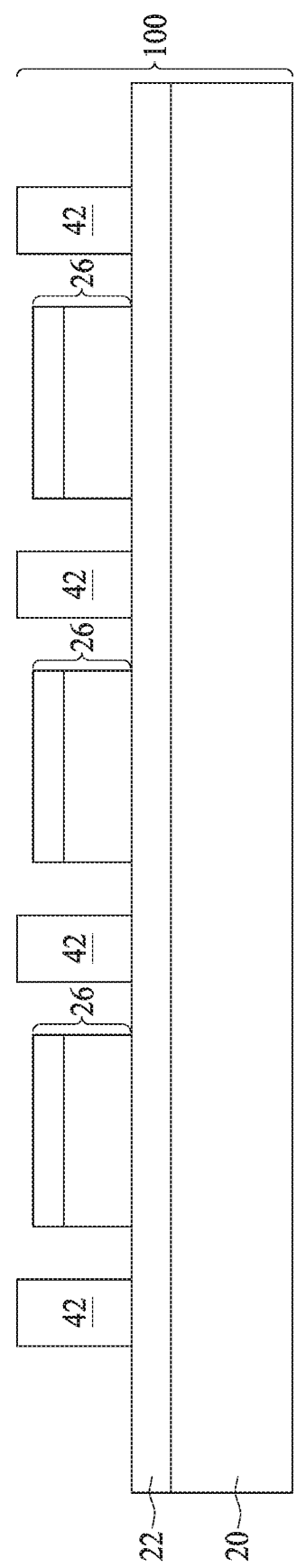

Next, as shown in FIG. 11, device dies 26 are placed over release layer 22 and carrier 20, wherein DAFs (not shown) may be used to attach device dies 26 to the underlying structure. Device dies 26 are known-good-dies. Device dies 26, through-vias 42, and the underlying carrier 20 etc. are in combination referred to as composite wafer 100.

Figure 12:
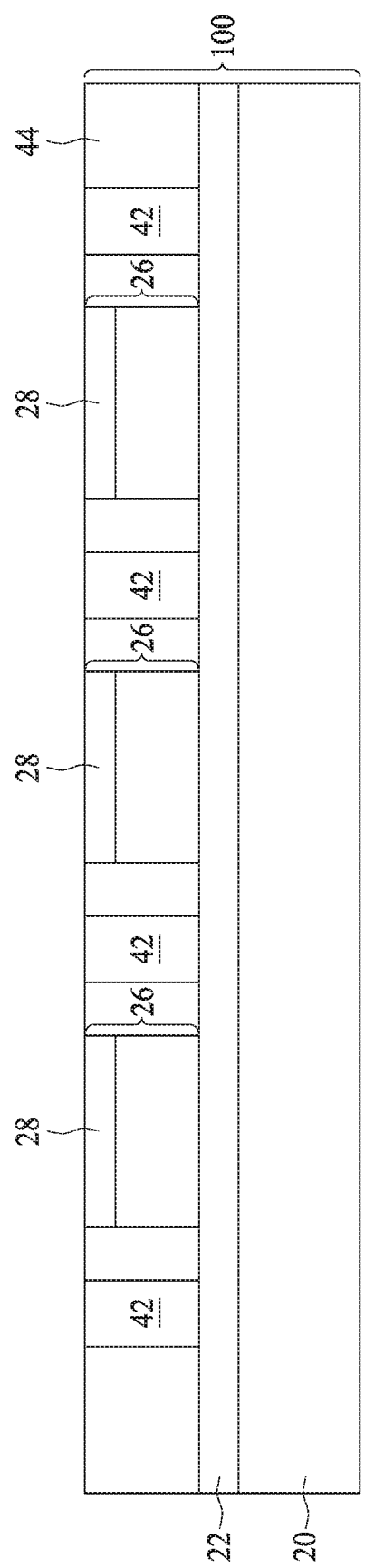
Figure 46:
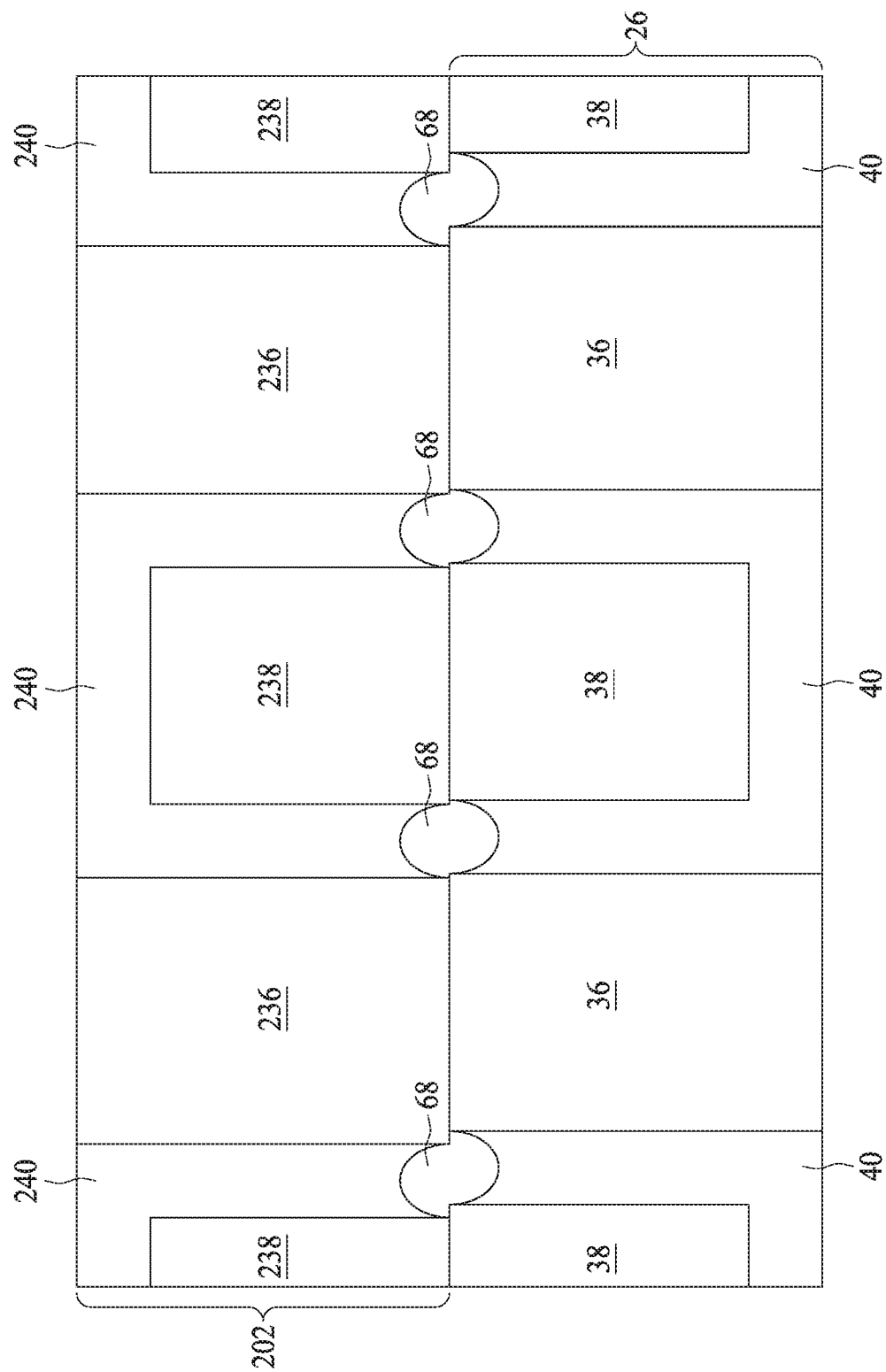

Next, referring to FIG. 12, encapsulating material 44 is encapsulated on composite wafer 100, followed by a planarization to remove the excess portions of encapsulating material 44. As a result, the top surface of through-vias 42 and the top surface of interconnect structure 28 are exposed. In accordance with some exemplary embodiments, the exposed top surface of interconnect structure 28 includes the exposed surfaces of bond pads 36 and surface dielectric layer 38, as shown in FIG. 44. In accordance with some embodiments, a proper slurry and proper planarization process conditions may be adopted to cause the top ends of dielectric liners 40 to be recessed more than bond pads 36 and surface dielectric layer 38, resulting in recesses in dielectric liners 40, which is shown in FIG. 46.

Figure 13:
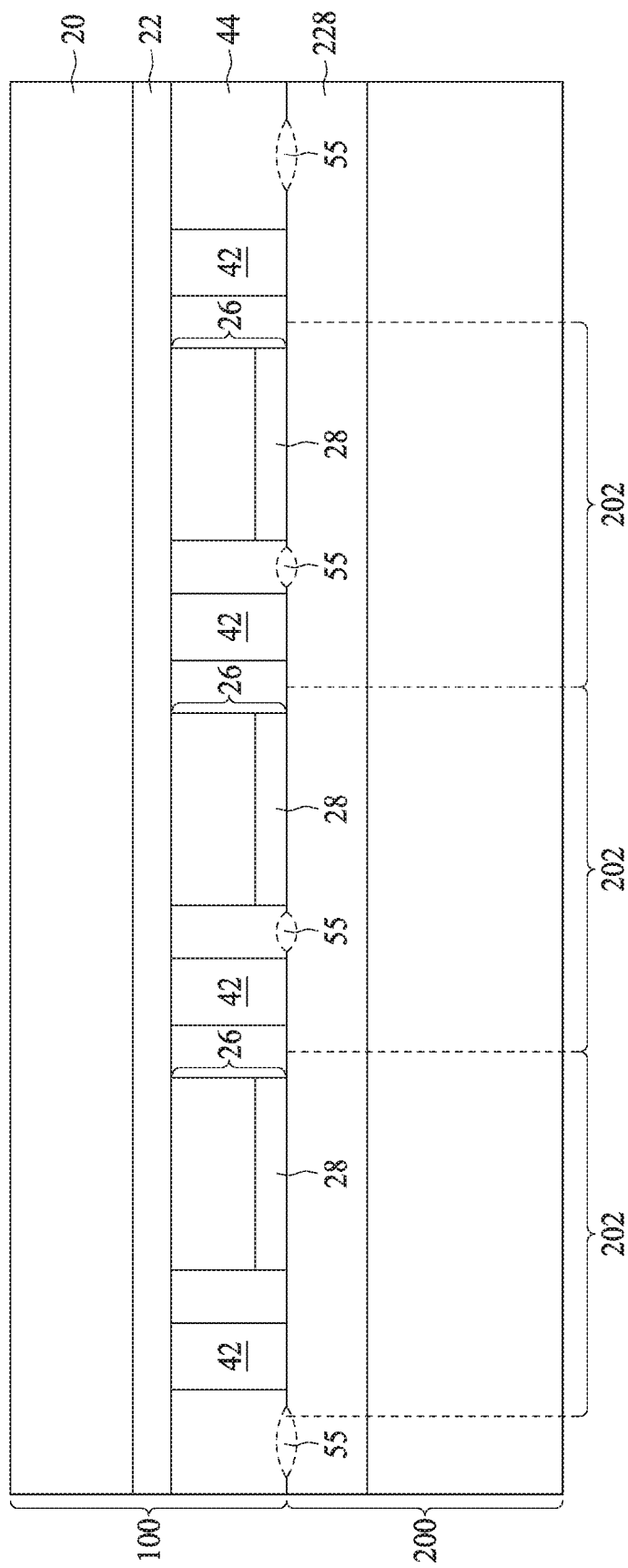

Next, referring to FIG. 13, composite wafer 100 and wafer 200 are bonded to each other through hybrid bonding, which occurs between device dies 26 and the corresponding device dies 202. On the other hand, encapsulating material 44 may be in contact with, but is not bonded to (with no chemical and physical bonds formed), the top surface of interconnect structure 228. Accordingly, it is likely that some parts of encapsulating material 44 are in physical contact with the surface dielectric materials and/or metallic materials in interconnect structure 228. It is also likely that some other parts of encapsulating material 44 are spaced apart from the respective underlying portions of the surface dielectric materials and/or metallic materials by air gaps 55, which are schematically illustrated in FIG. 13. Air gaps 55 may be generated due to the non-coplanarity of encapsulating material 44, which is caused in the planarization of encapsulating material 44. It is appreciated that the locations and the sizes of air gaps 55 are random, and the sizes of the illustrated air gaps 55 may have been exaggerated.

The structure shown in FIG. 13 differ from the structure in FIG. 6 in that in FIG. 6, encapsulating material 44 is dispensed in a fluid form to contact interconnect structure 228, and is then cured. Accordingly, in the embodiments in FIG. 6, encapsulating material 44 is not only in physical contact with, but is also bonded to, the top surface of in connect structure 228. Also, in the embodiments in FIG. 6, there is no air gap formed at the interface of encapsulating material 44 and interconnect structure 228.

Figure 14:
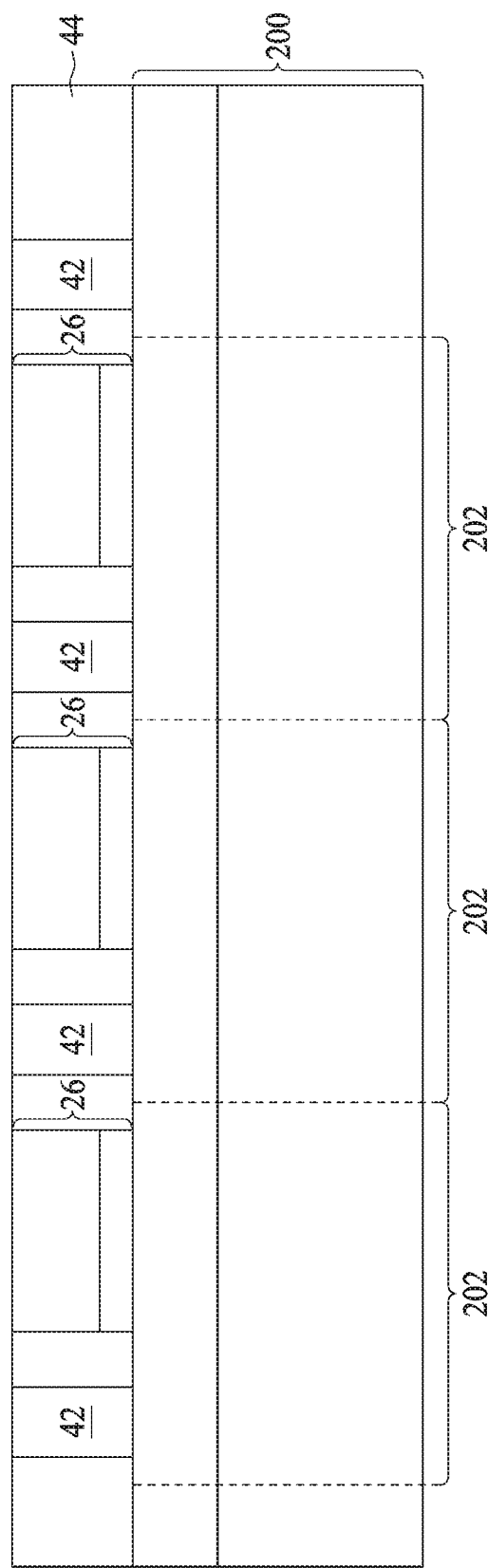
Figure 15:
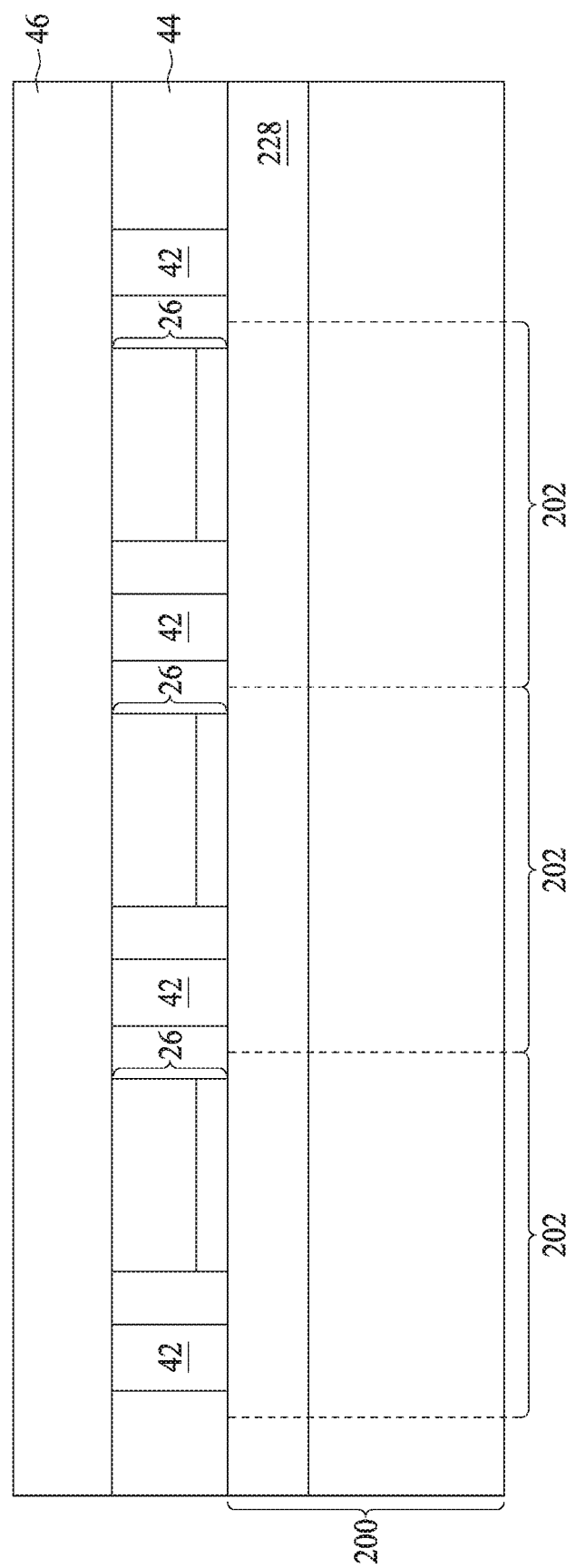
Figure 16:
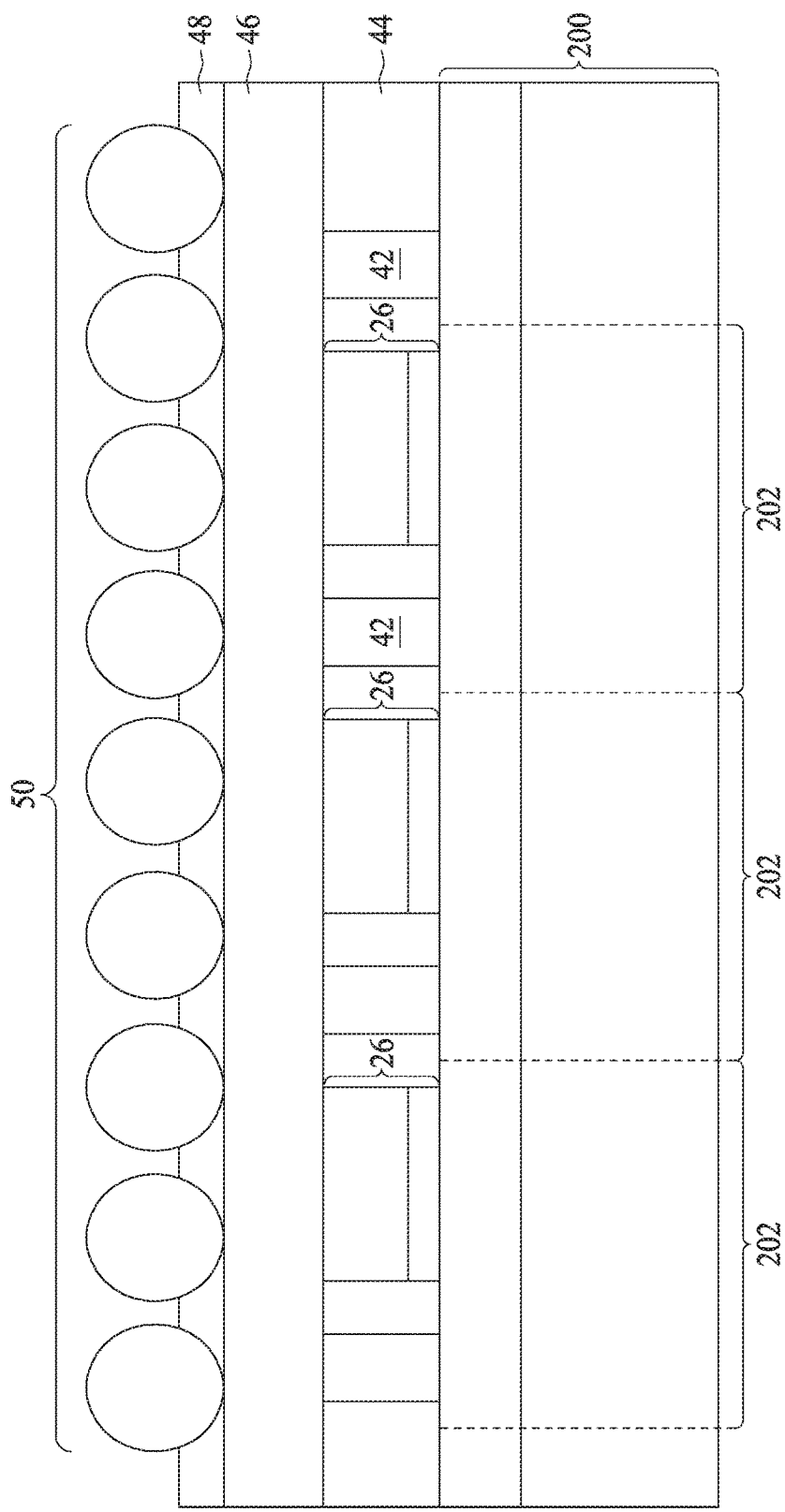
Figure 17:
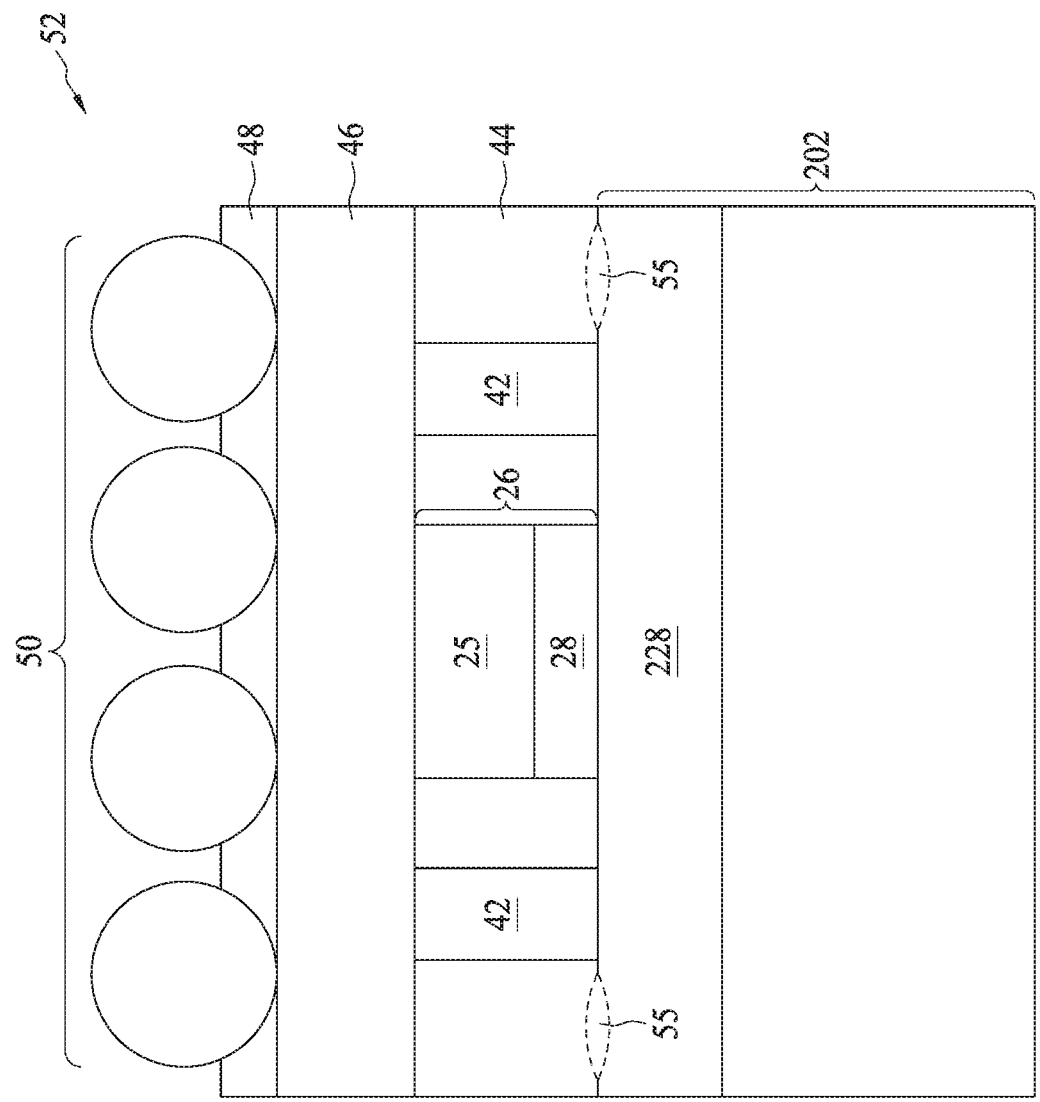

After the step in FIG. 13 is formed, the process is continued, and carrier 20 is de-bonded, for example, by de-composing release layer 22 using a high-energy light. The resulting structure is shown in FIG. 14. The subsequent steps, which are shown in FIGS. 15 through 17, are essentially the same as shown in FIGS. 7 through 9, and the process details and the corresponding materials are not repeated herein. In the resulting package as shown in FIG. 17, encapsulating material 44 is in contact with, and may not be bonded to, the surface of interconnect structure 228. Encapsulating material 44 is bonded to the overlying interconnect structure 46. Also, air gaps 55 may (or may not) be formed.

FIGS. 18 through 26 illustrate the cross-sectional views of intermediate stages in the formation of a package in accordance with some embodiments. These embodiments differ from the embodiments in FIGS. 1 through 17 in that the two wafers involved in the wafer-to-wafer hybrid bonding are both composite wafers. As a result, in the resulting package, the encapsulating material encircles both dies.

Figure 18:
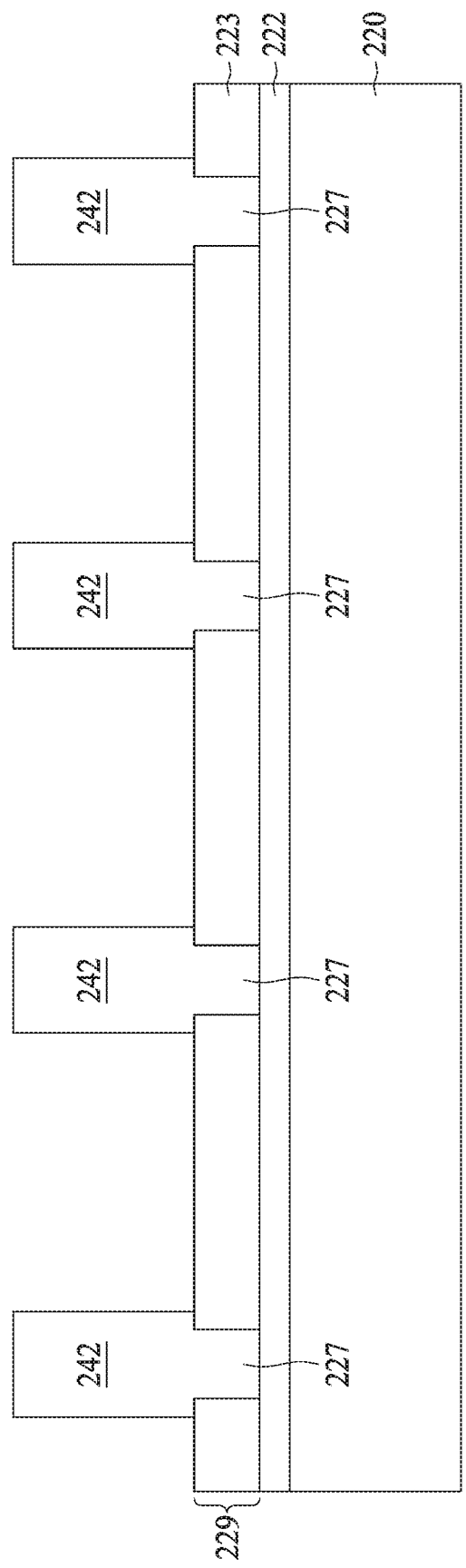
FIGS. 18 through 26 illustrate the cross-sectional views of intermediate stages in the formation of a package in accordance with some embodiments.

Referring to FIG. 18, carrier 220 and release layer 222 are provided, which are essentially the same as features 20 and 22 (FIG. 20), respectively. Dielectric layer(s) 223 are formed on release layer 222. In accordance with some embodiments of the present disclosure, dielectric layer 223 is formed of a polymer. Dielectric layer 223 may also be formed of a photo-sensitive material such as polybenzoxazole (PBO), polyimide, benzocyclobutene (BCB), or the like, which may be patterned through light exposure and development. In accordance with alternative embodiments, dielectric layer 223 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 19:
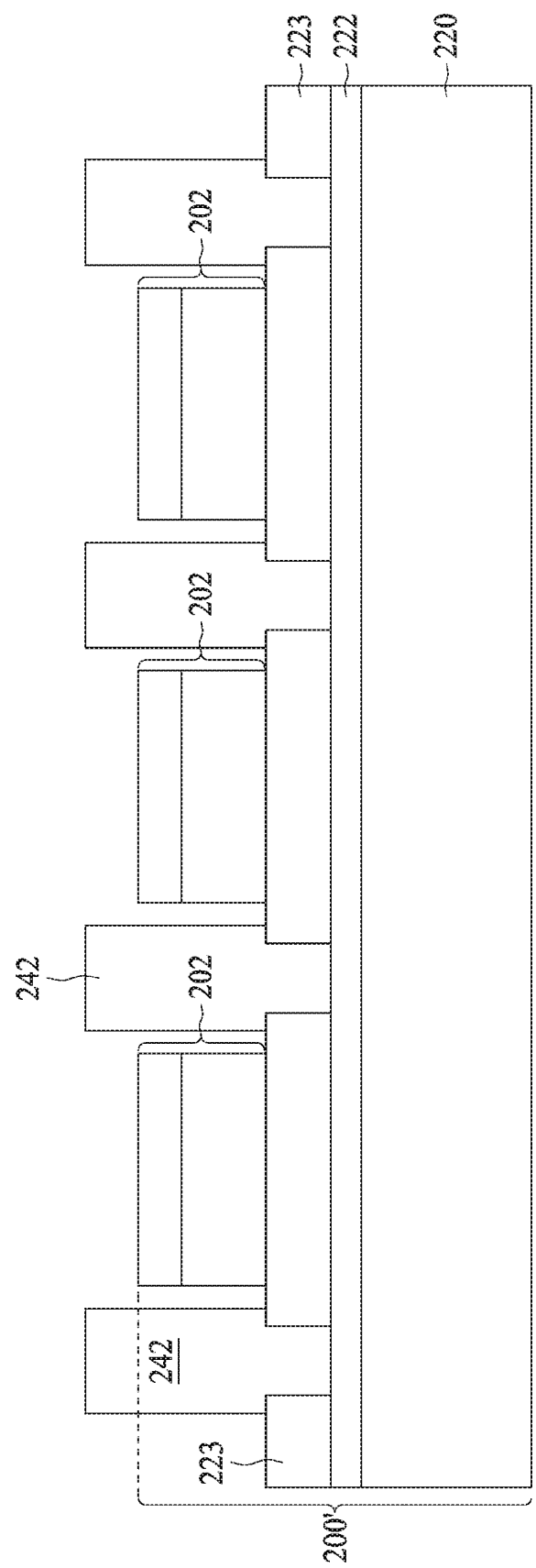

Through-vias 242 are formed over dielectric layer 223. Furthermore, interconnect structure 229 is formed, which includes RDLs 227 in dielectric layer 223. In accordance with some embodiments, RDLs 227 include metal lines (not shown) and vias. In accordance with alternative embodiments, RDLs 227 include a single layer of vias as shown in FIG. 18. Next, as shown in FIG. 19, device dies 202 are placed over and attached to dielectric layer 223. Device dies 202 are also sawed from wafer 200 (FIG. 3), and are known-good-dies. Composite wafer 200' is thus formed.

Figure 20:
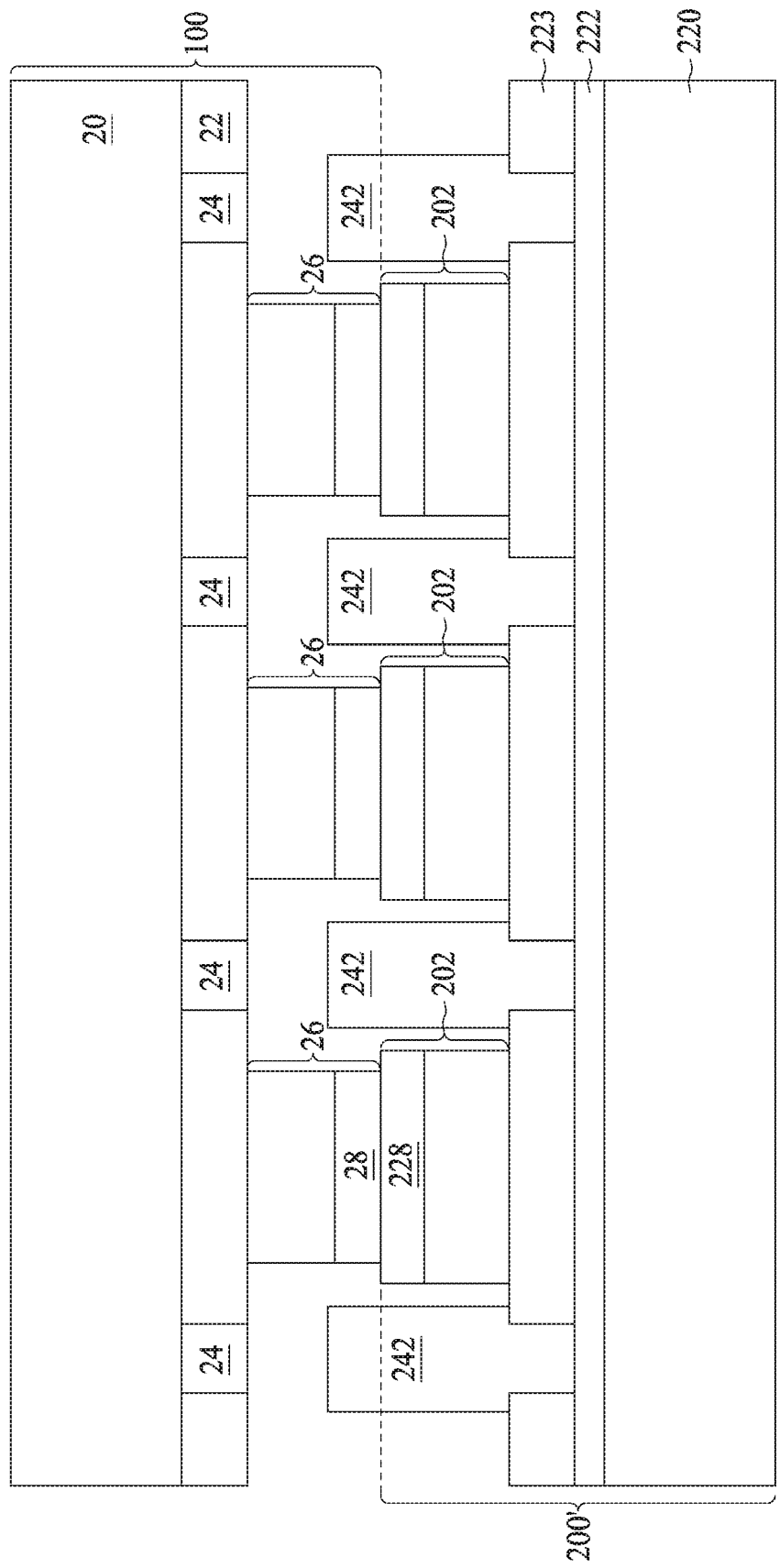
Figure 21:
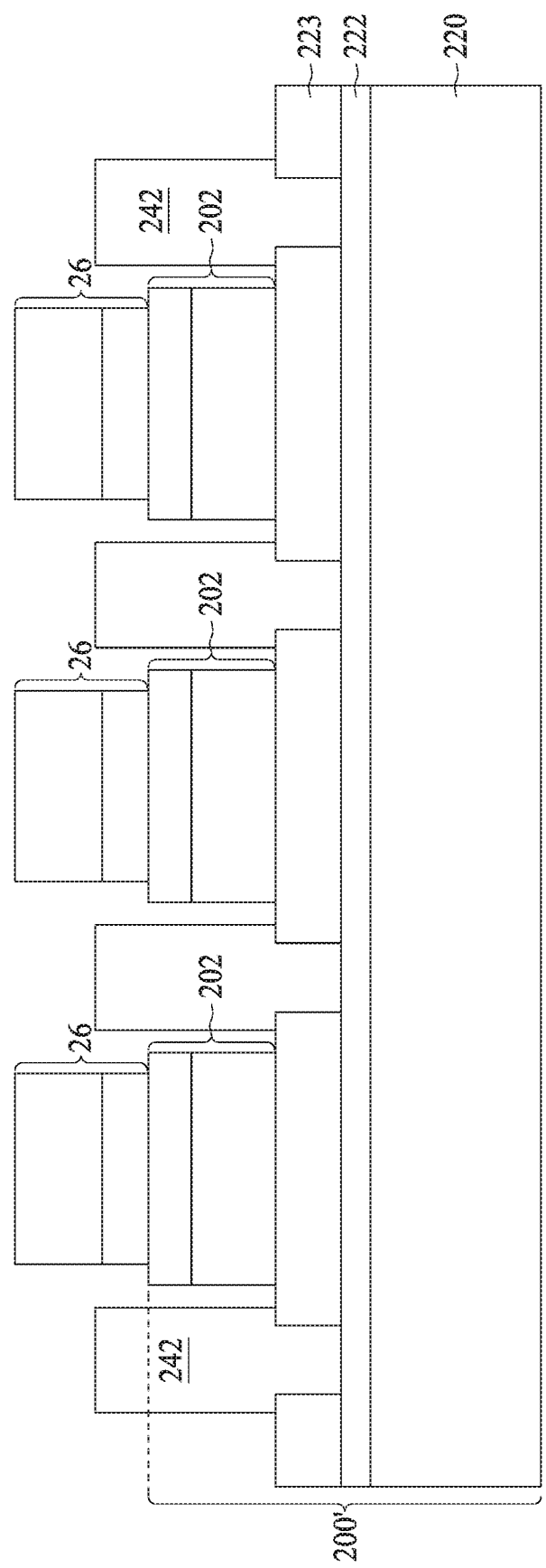
Figure 22:
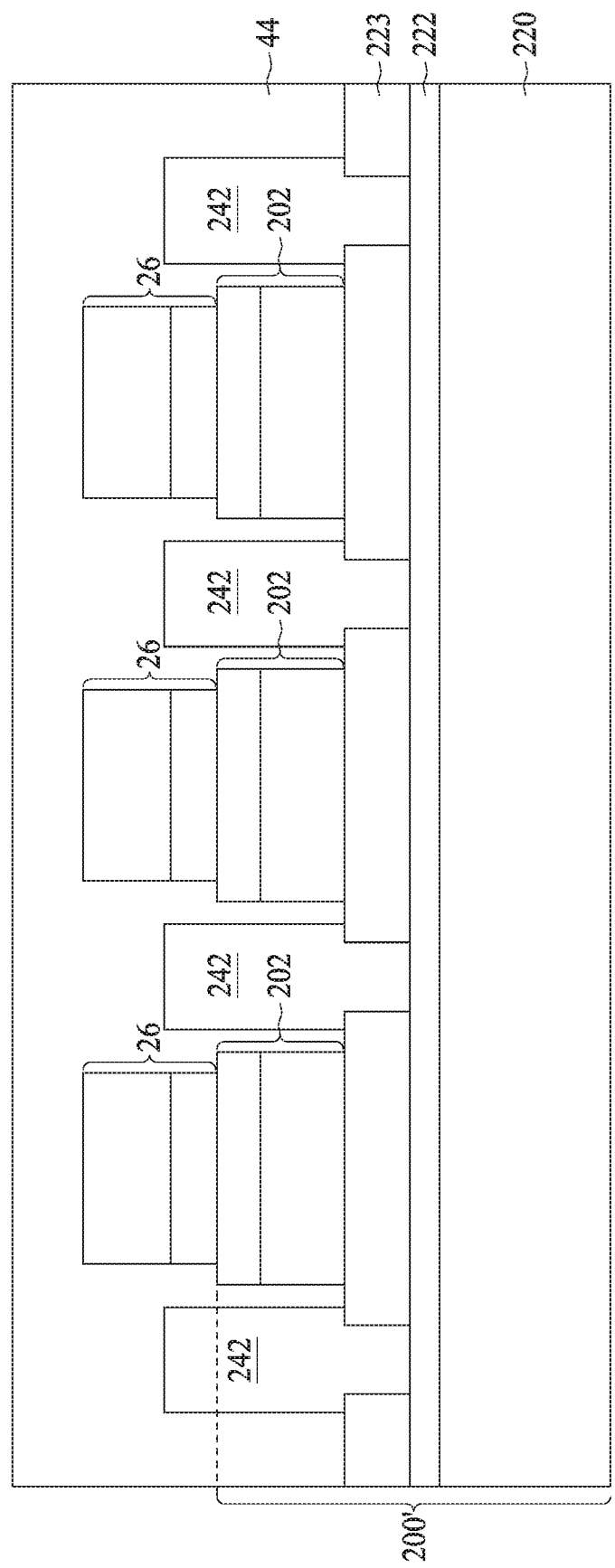
Figure 23:
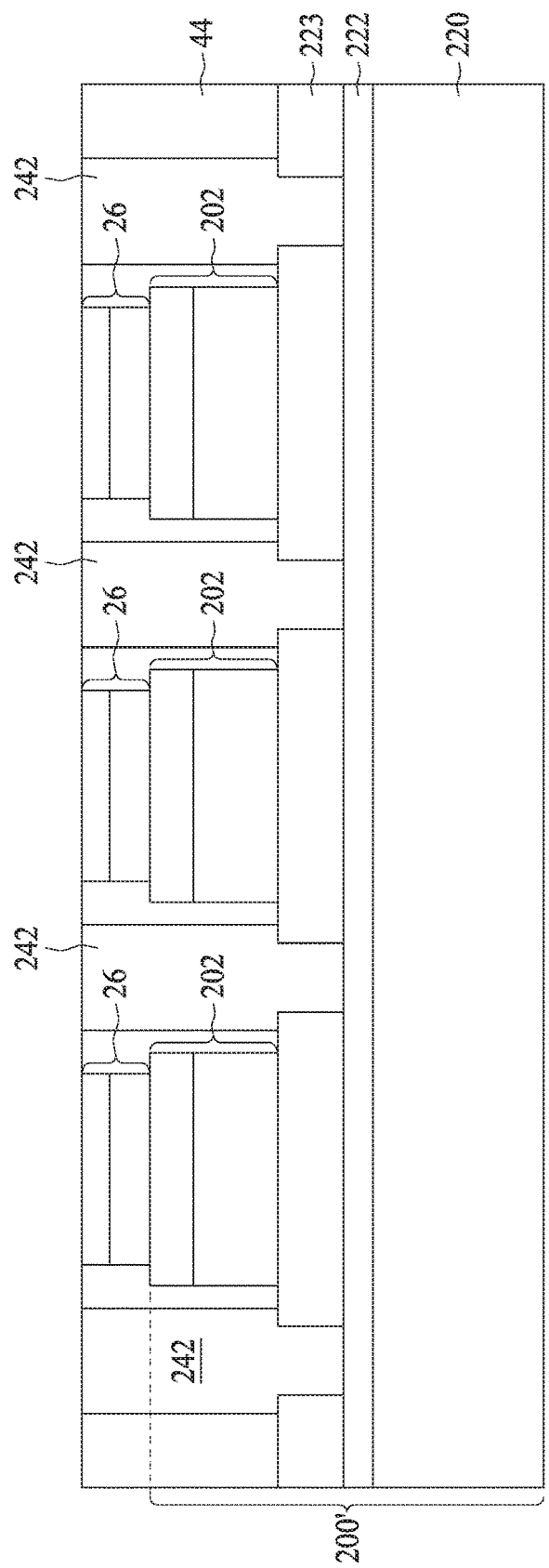
Figure 24:
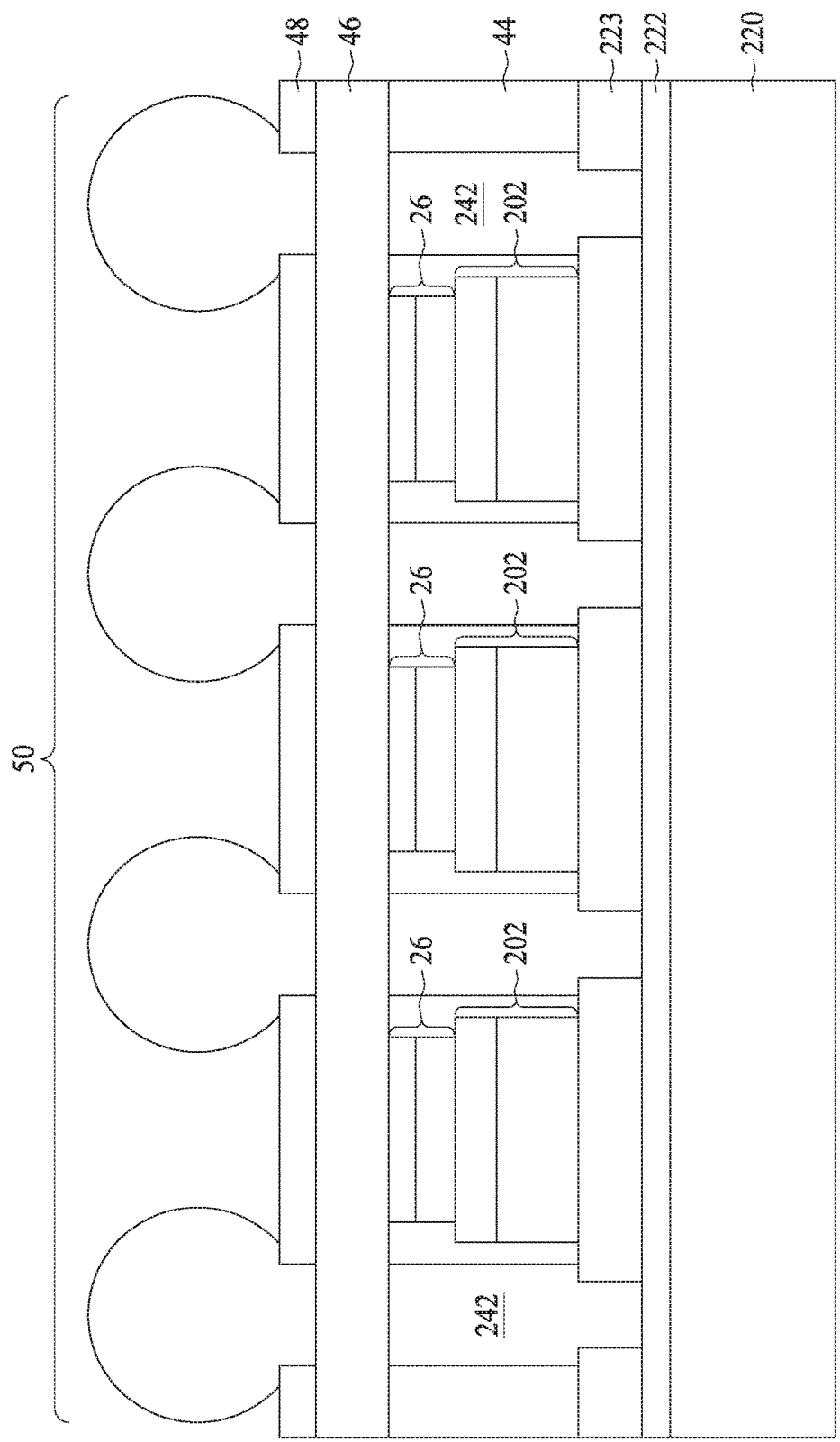
Figure 25:
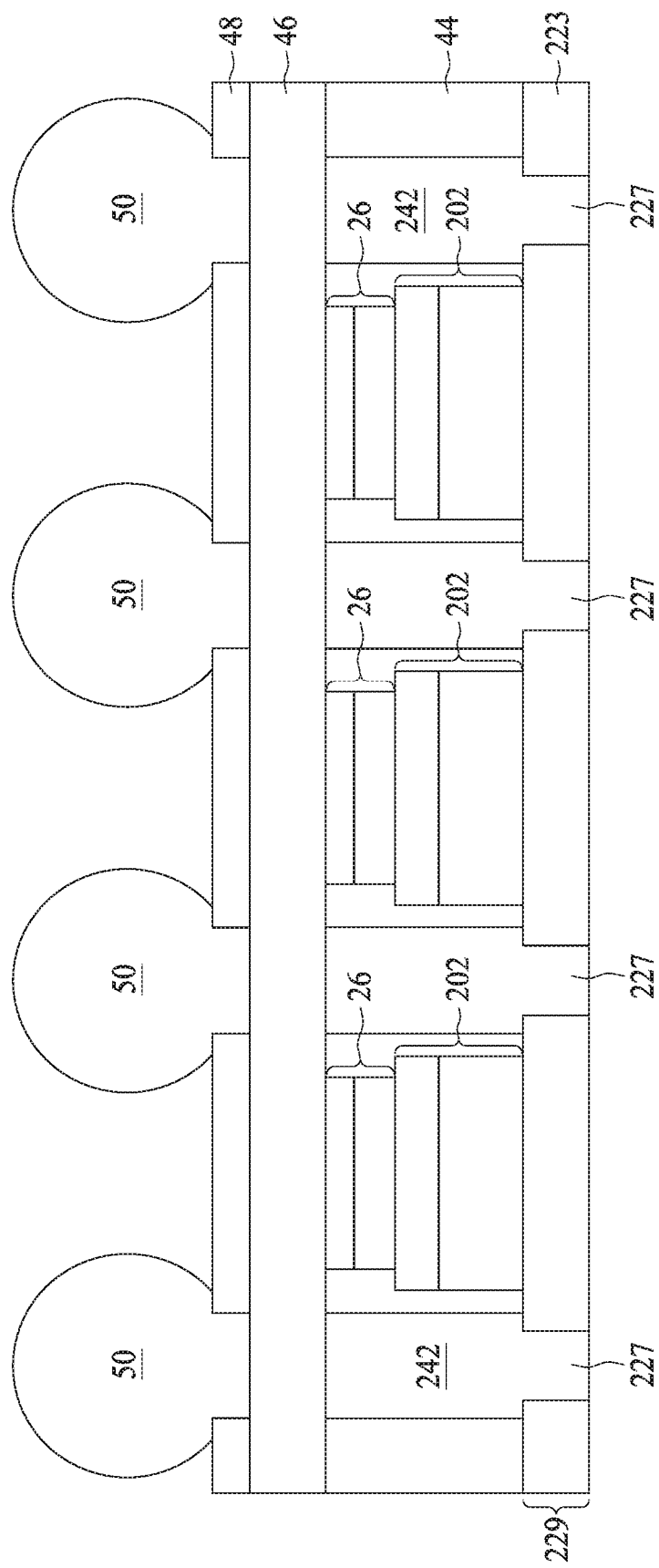

Next, referring to FIG. 20, composite wafer 100 and composite wafer 200' are bonded to each other, with device dies 26 bonded to device dies 202 through hybrid bonding. The formation of composite wafer 100 is shown in FIGS. 1 and 2. The positions of alignment marks 24 in composite wafer 100 may be designed to align to (and may overlap) the corresponding through-vias 42, and through-vias 42 and alignment marks 24 are in combination used as alignment marks in the alignment of wafers 100 and 200'. The bonding process may be essentially the same as shown and discussed referring to FIGS. 4 and 5, and is not repeated herein. After the de-bonding of carrier 20 in composite wafer 100, the resulting structure includes device dies 26 bonded to device dies 202 in composite wafer 200, as shown in FIG. 21. In subsequent steps, encapsulating material 44 is dispensed and cured, as shown in FIG. 22. A planarization is then performed to expose and thin device dies 26, as shown in FIG. 23. Through-vias 242 are also exposed. The subsequent steps as shown in FIGS. 24 through 26 are essentially the same as the steps shown in FIGS. 7 through 9, and the process details and the corresponding materials are not repeated herein.

Figure 26:
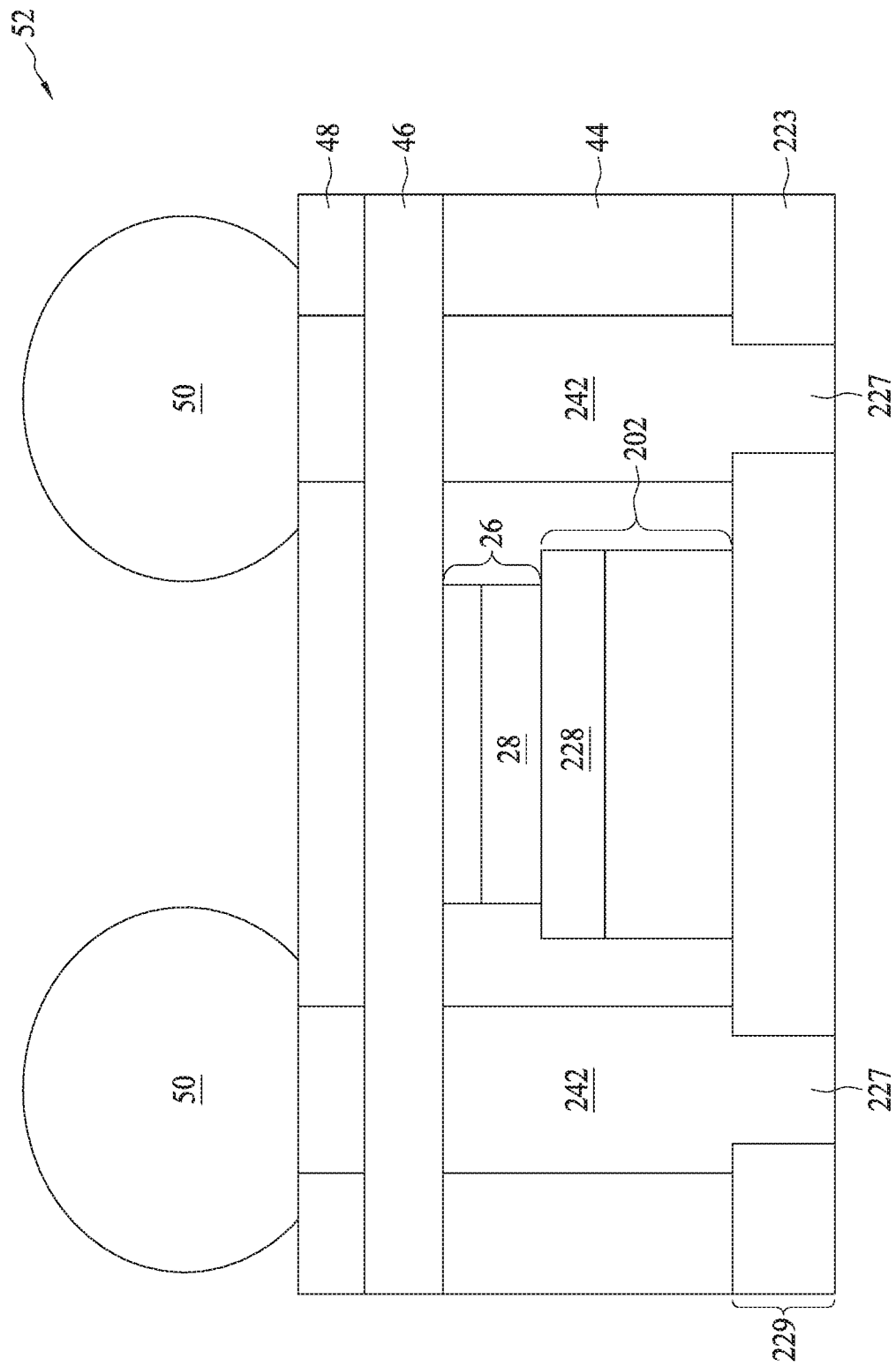

In the package shown in FIG. 26, encapsulating material 44 encapsulates both device dies 26 and 202, and continuously extends from the top surface of device die 26 to the bottom surface of device die 202. In addition, since there is a single encapsulating material 44 formed in one process, no distinguishable interface is in encapsulating material 44. For example, no distinguishable interface in encapsulating material 44 is level with the interface between device dies 26 and 202. Each of through-vias 42 is also a continuous via having continuous and straight edges, and no distinguishable interface is in through-via 42, for example, at the level of the interface between device dies 26 and 202.

Figure 33:
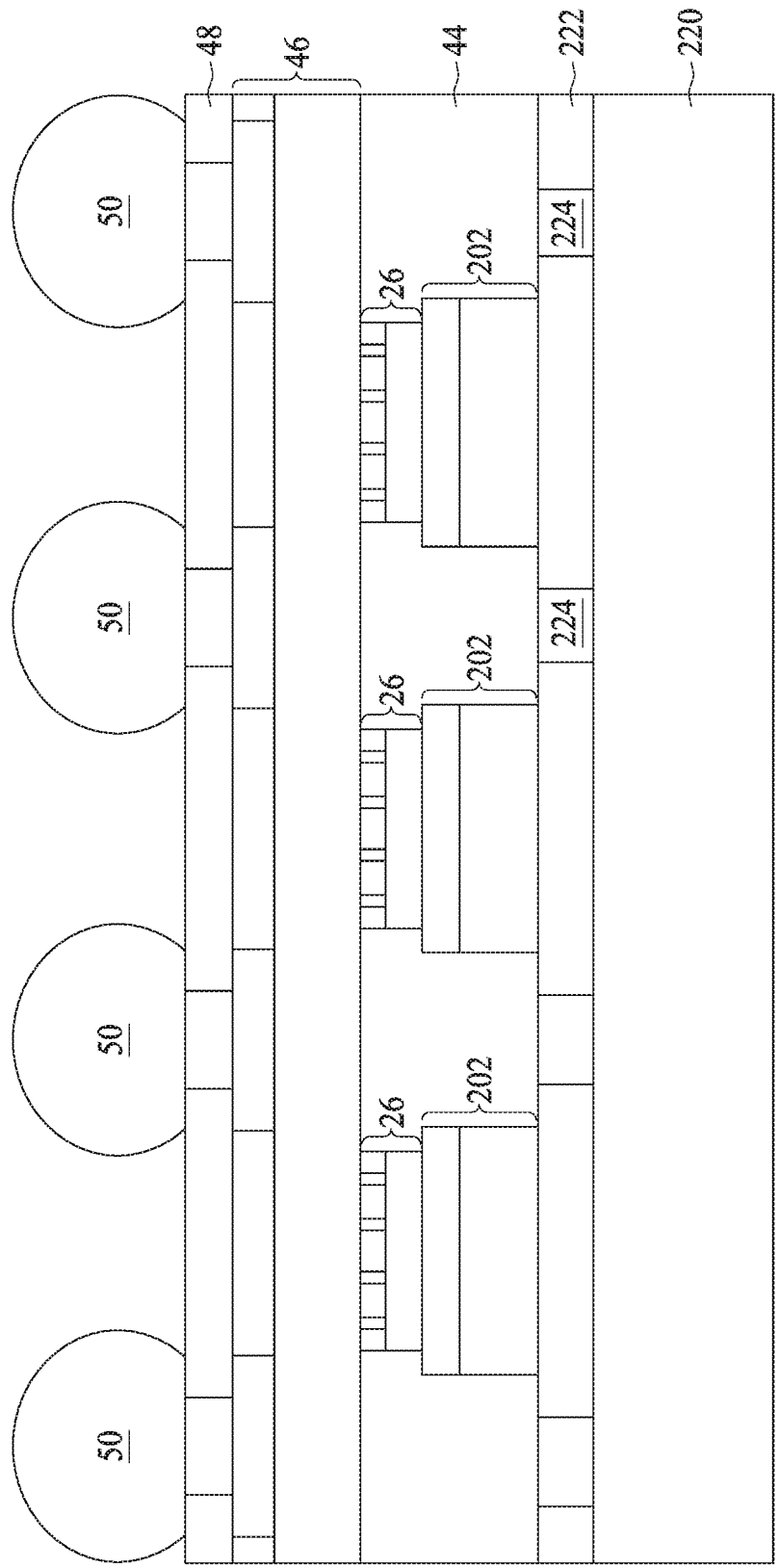
Figure 34:
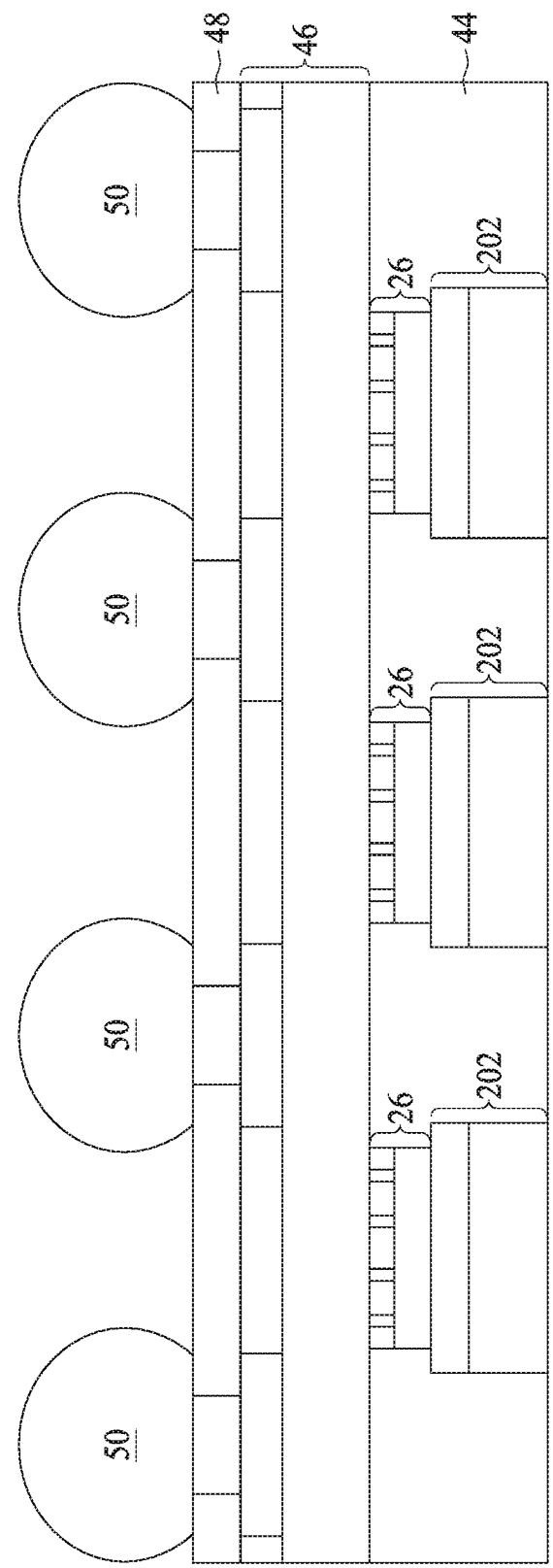
Figure 35:
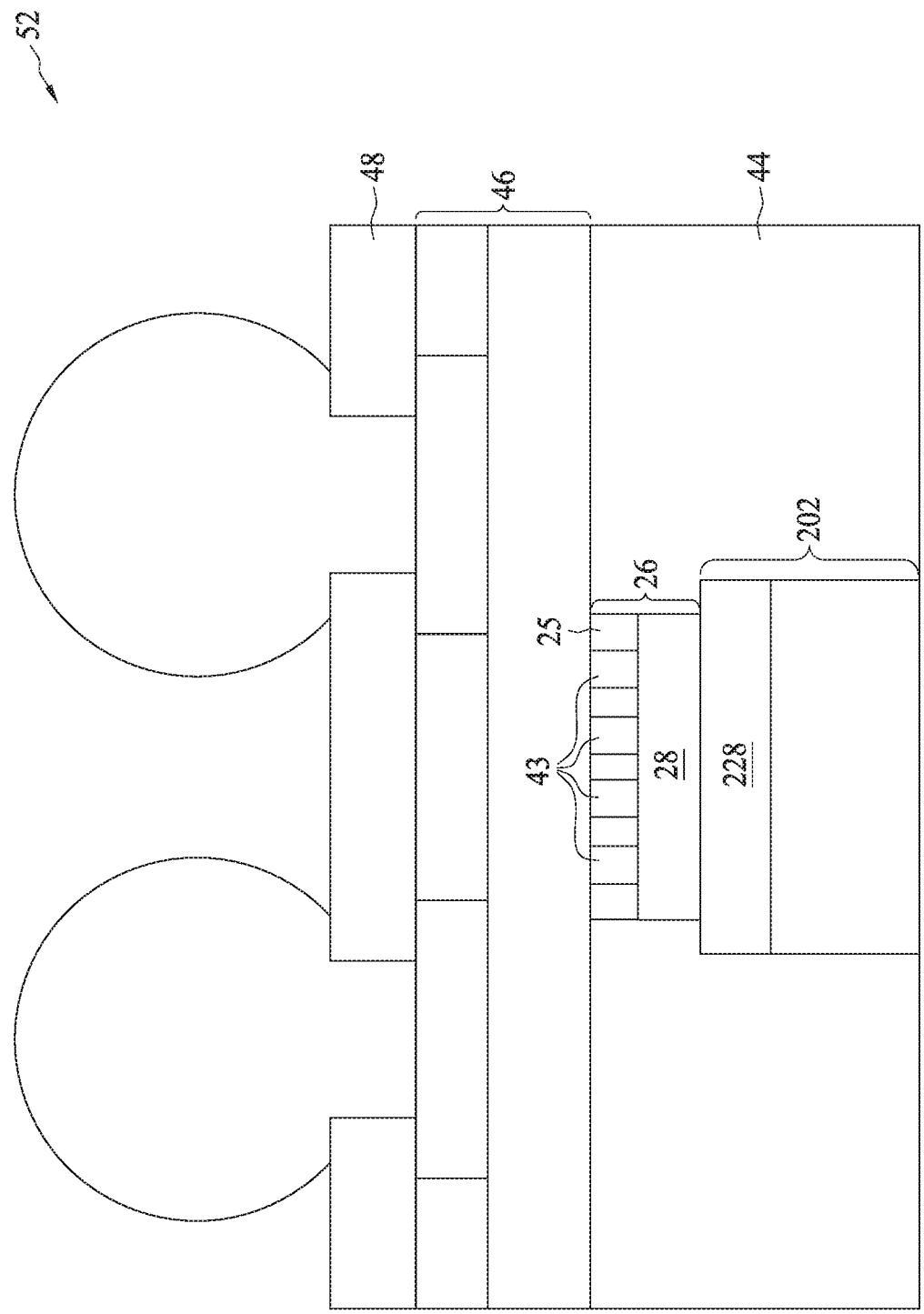

FIGS. 27 through 35 illustrate the cross-sectional views of intermediate stages in the formation of a package in accordance with some embodiments. These embodiments differ from the embodiments in FIGS. 18 through 26 in that no through-vias are formed in the encapsulating material. Rather, through-vias 43 are formed in device die 26 to electrically couple device die 202 to interconnect structure 46 (FIG. 35).

Figure 27:
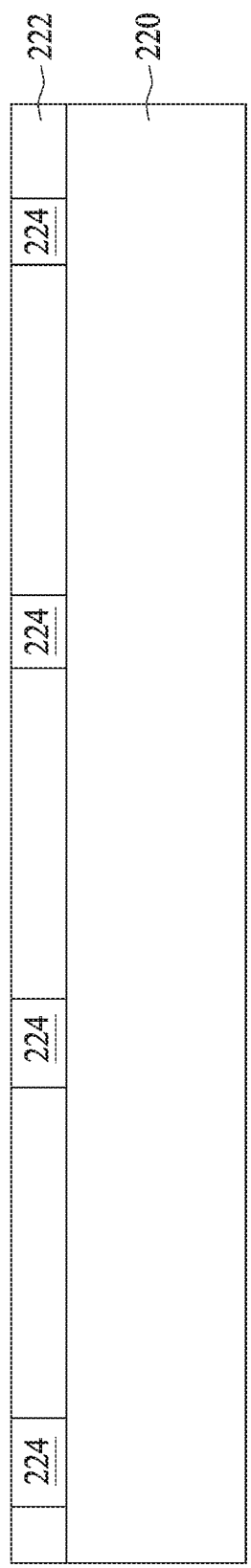
FIGS. 27 through 35 illustrate the cross-sectional views of intermediate stages in the formation of a package in accordance with some embodiments.
Figure 28:
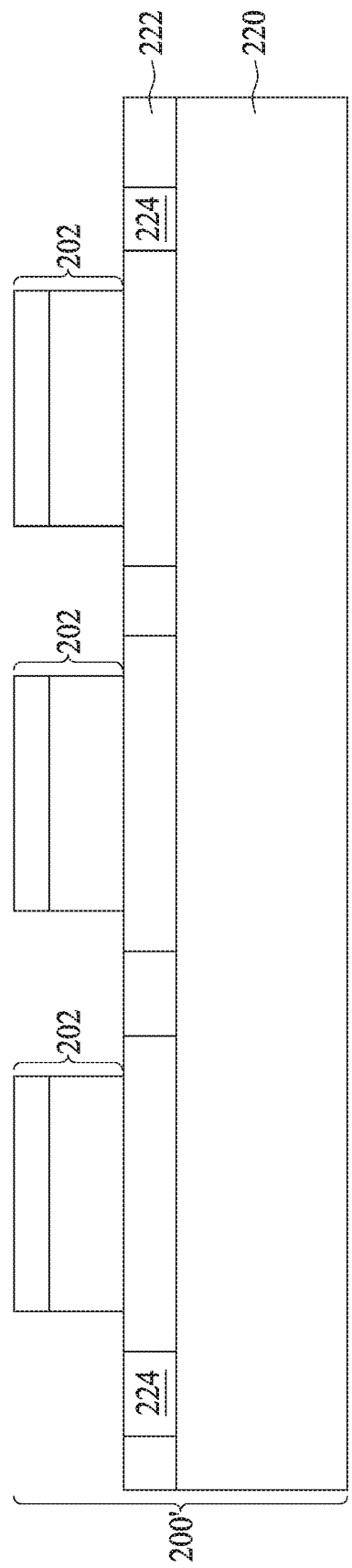

The process shown in FIGS. 27 and 28 illustrate the formation of composite wafer 200'. The process steps are similar to the steps shown in FIGS. 18 and 19, except no through-vias are formed. Alignment marks 224 are formed, for example, in release layer 222. As shown in FIG. 28, device dies 202 are attached to release layer 222.

Figure 29:
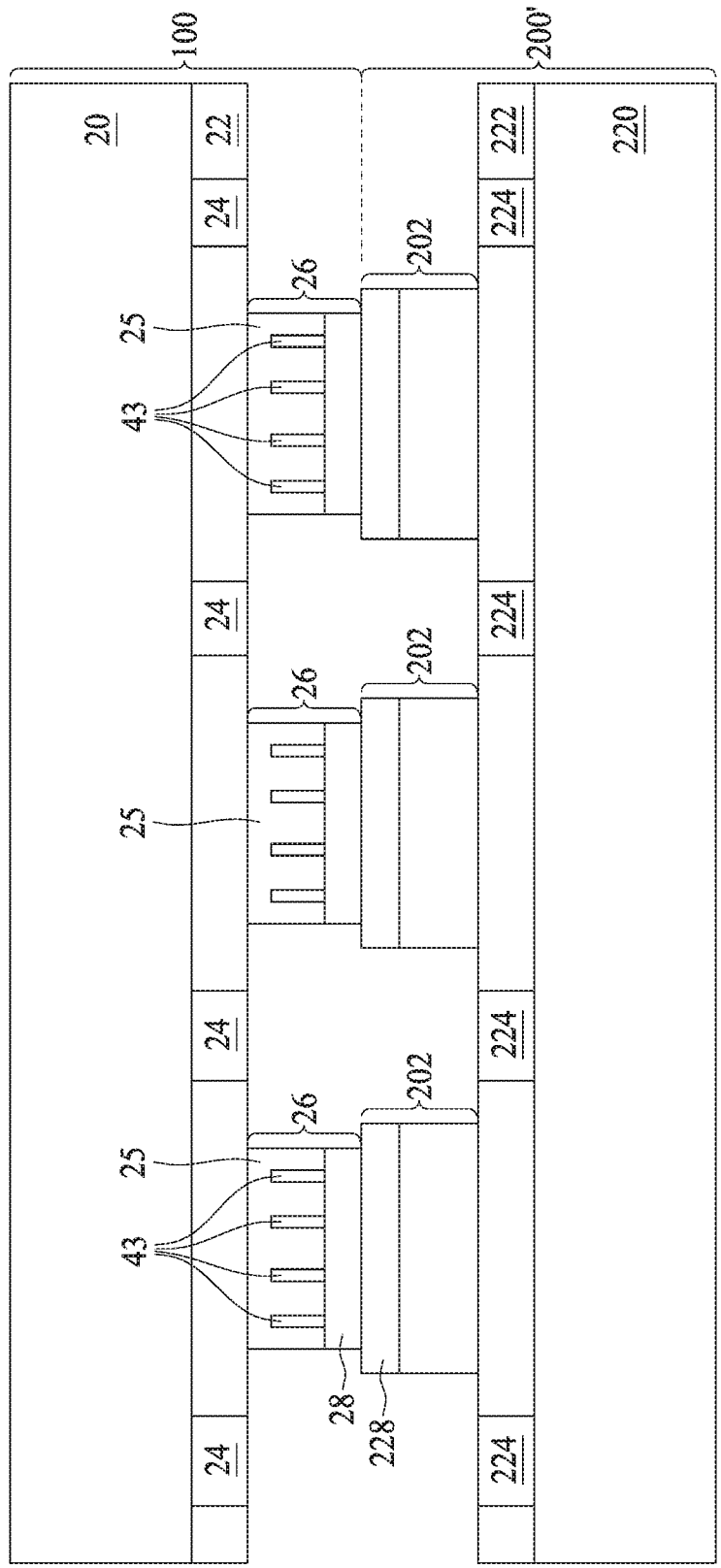
Figure 30:
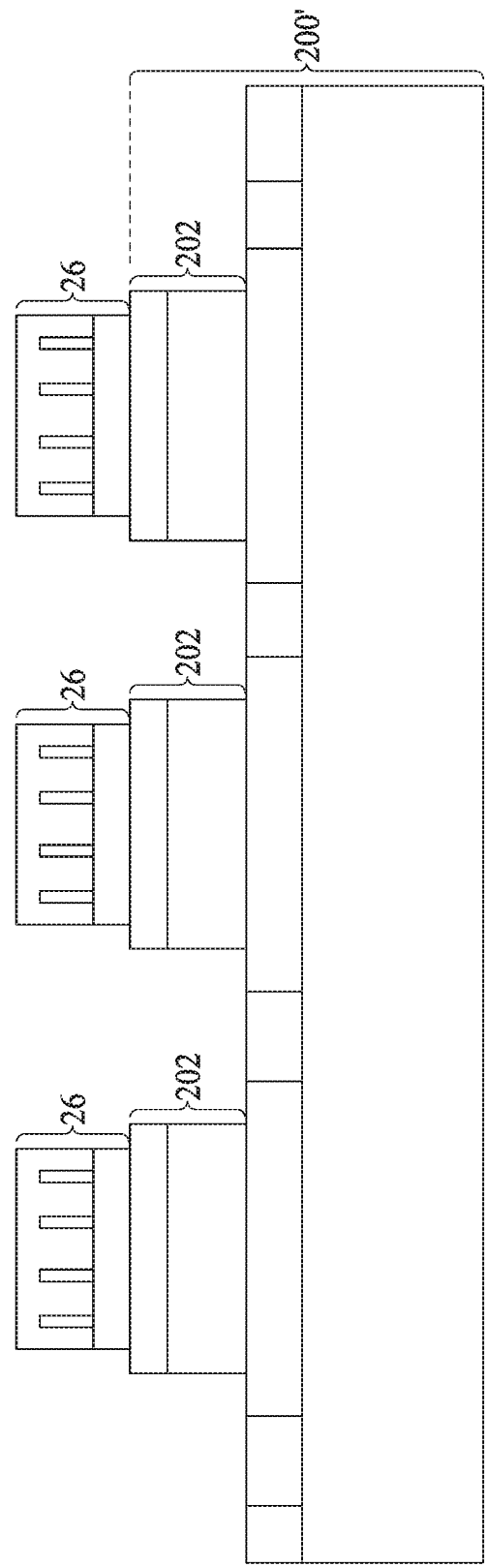

FIG. 29 illustrates the bonding of composite wafer 100 to composite wafer 200', wherein device dies 26 are bonded to respective device dies 202 through hybrid bonding. Device dies 26 include through-vias 43 extending into semiconductor substrates 25. Carrier 20 is then de-bonded, as shown in FIG. 30.

Figure 31:
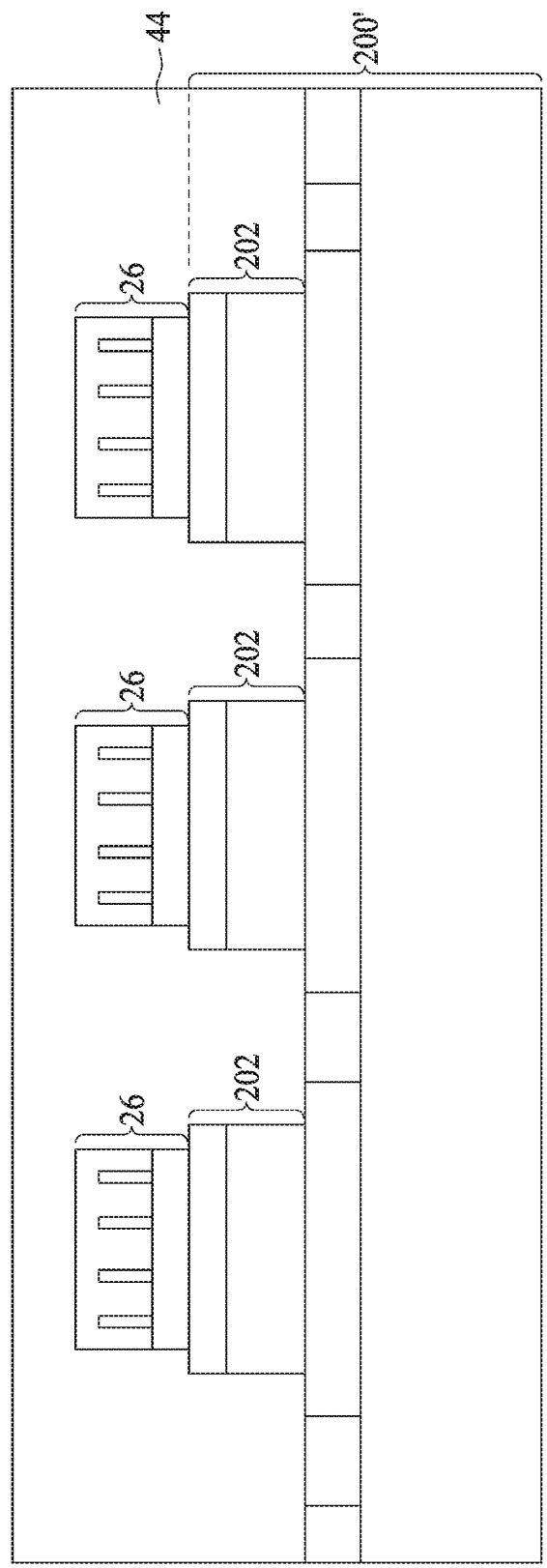
Figure 32:
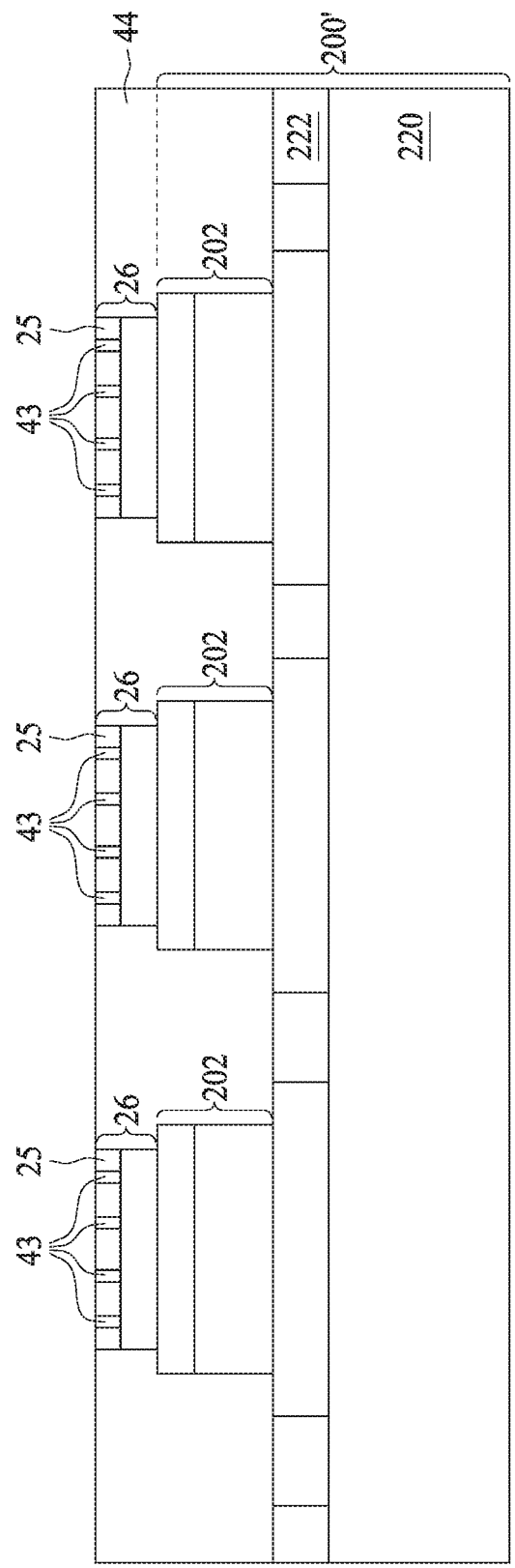

Next, referring to FIG. 31, encapsulating material 44 is encapsulate on device dies 26 and 202, followed by a planarization step as shown in FIG. 32. During the planarization, device dies 26 are also thinned, and semiconductor substrates 25 are thinned to expose through-vias 43. The subsequent steps as shown in FIGS. 33 through 35 are essentially the same as shown in FIGS. 7 through 9, and the process details and the corresponding materials are not repeated herein.

In the resulting structure as shown in FIG. 35, encapsulating material 44 encircles both device dies 26 and 202. No through-vias are formed in encapsulating material 44. Also, encapsulating material 44 is formed in a single process, and hence no distinguishable interface is in encapsulating material 44. The electrical connection of device die 202 to interconnect structure 46 is through through-vias 43 in semiconductor substrate 25.

Figure 36:
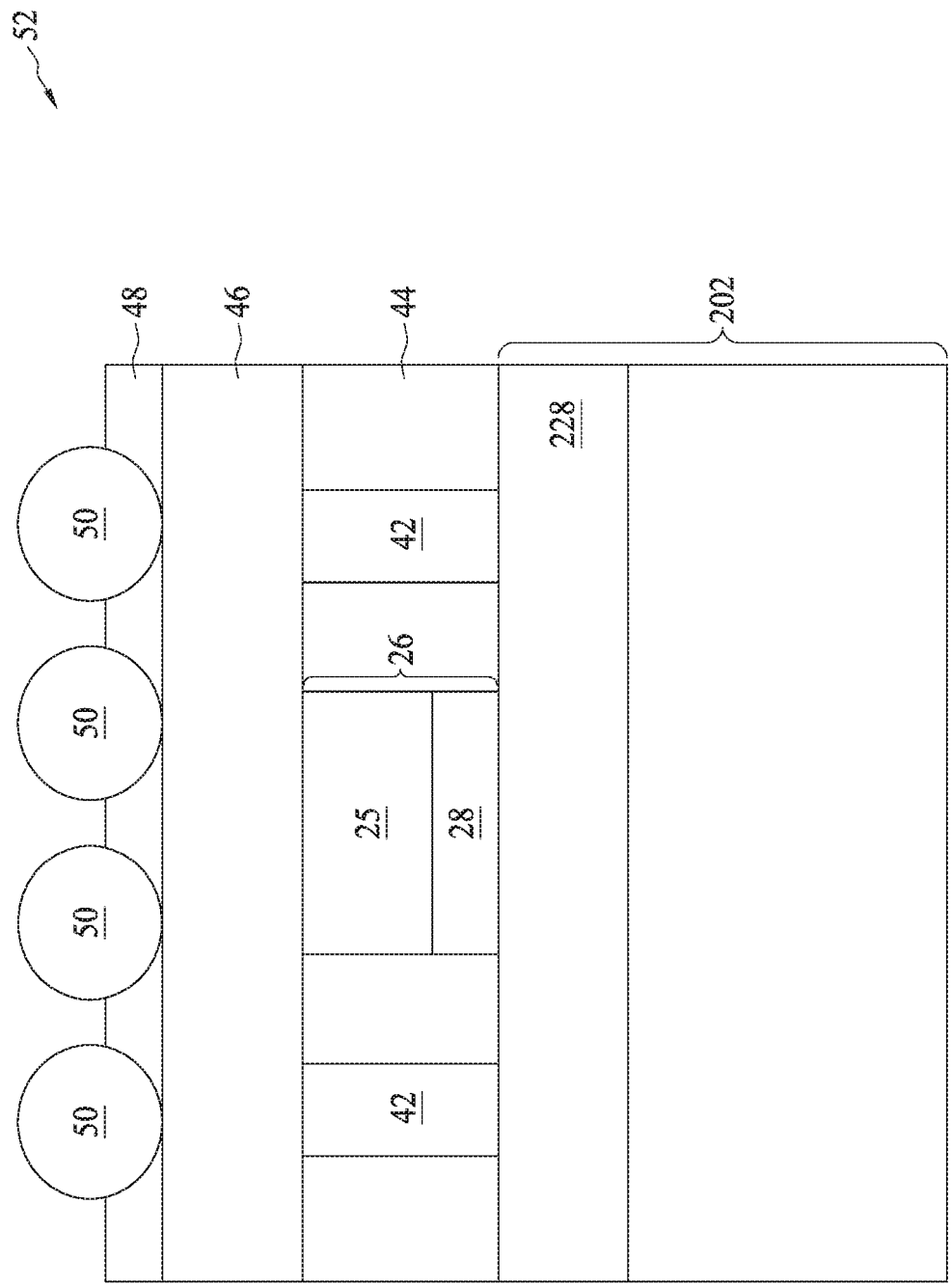
FIGS. 36 through 43 illustrate the cross-sectional views of some packages in accordance with some embodiments.
Figure 47:
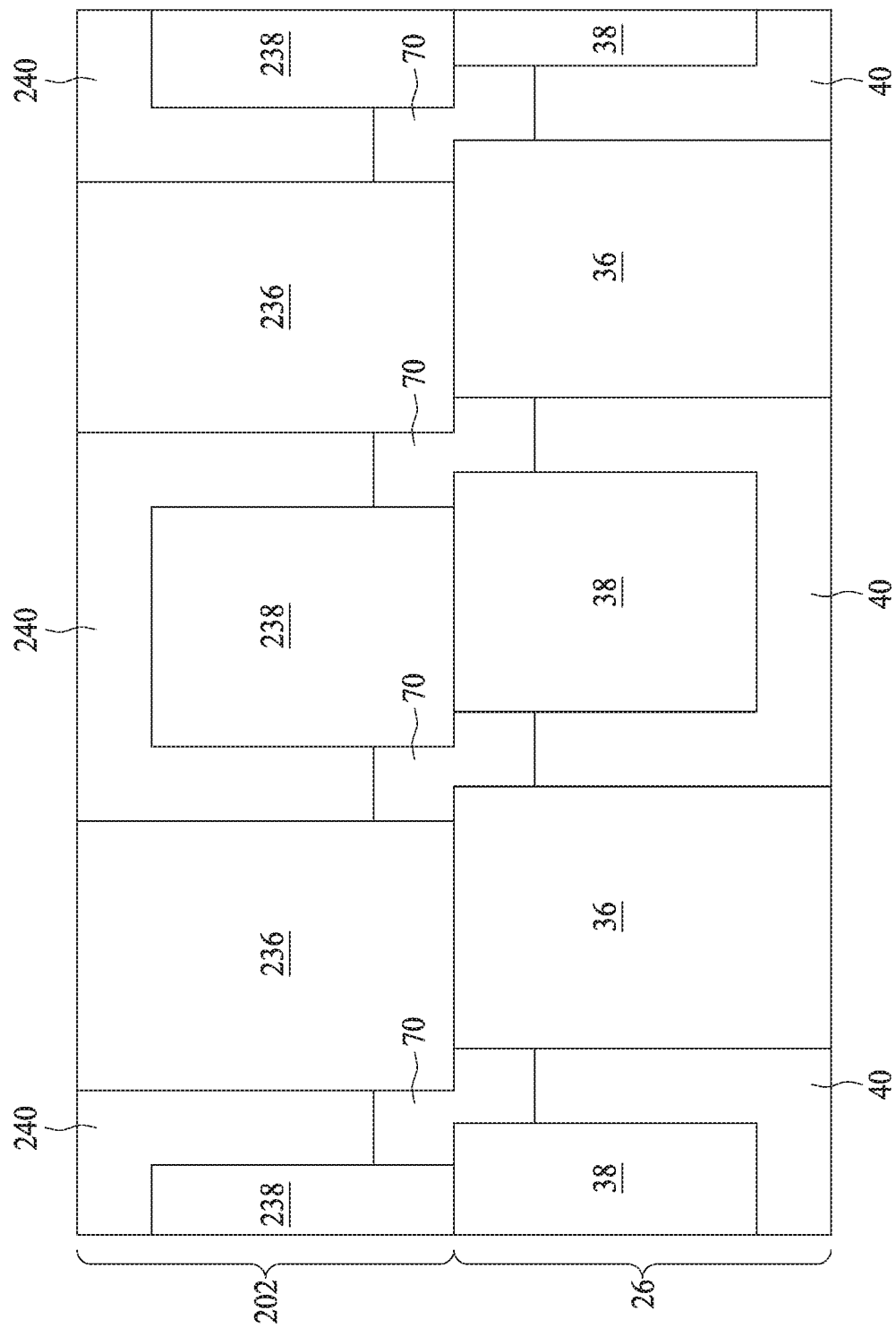

FIGS. 36 through 43 illustrate the cross-sectional views of packages formed in accordance with some embodiments of the present disclosure. FIG. 36 illustrates the package as shown in FIG. 9 or FIG. 17. FIG. 37 illustrates the package similar to the package in FIG. 36, except an additional device die 60 is bonded to interconnect structure 46. The bonding may also be hybrid bonding, similar to what is shown in FIGS. 45, 46, and 47. Through-vias 62 are formed starting from the metal pads (not shown) in interconnect structure 46. Encapsulating material 64 encapsulates device die 60 and through-vias 62 therein. Furthermore, interconnect structure 66, dielectric layer 48, and electrical connectors 50 are formed. Electrical connectors 50 are electrically coupled to through-vias 62, interconnect structure 46, through-vias 42, and device die 202.

Figure 38:
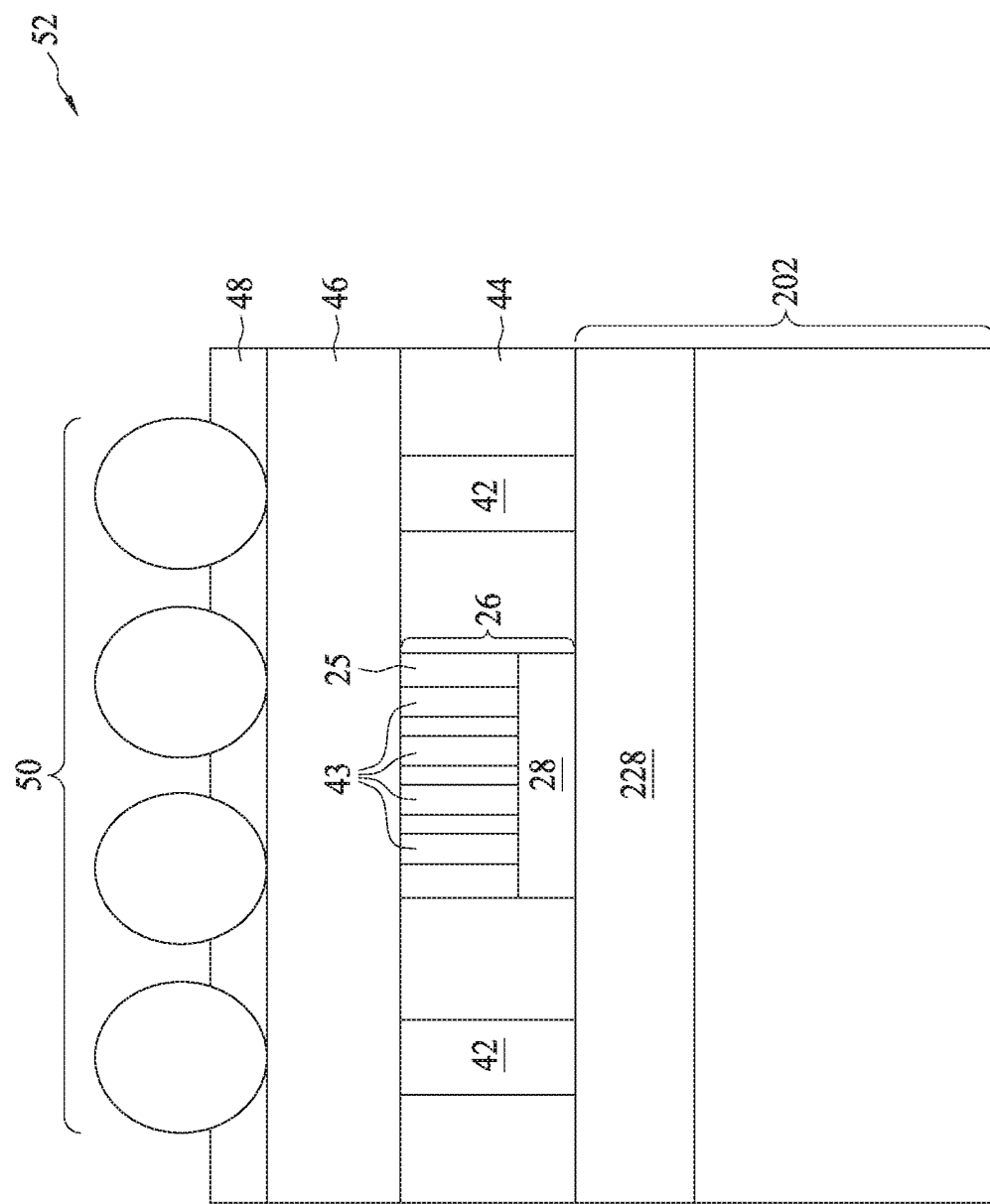
Figure 39:
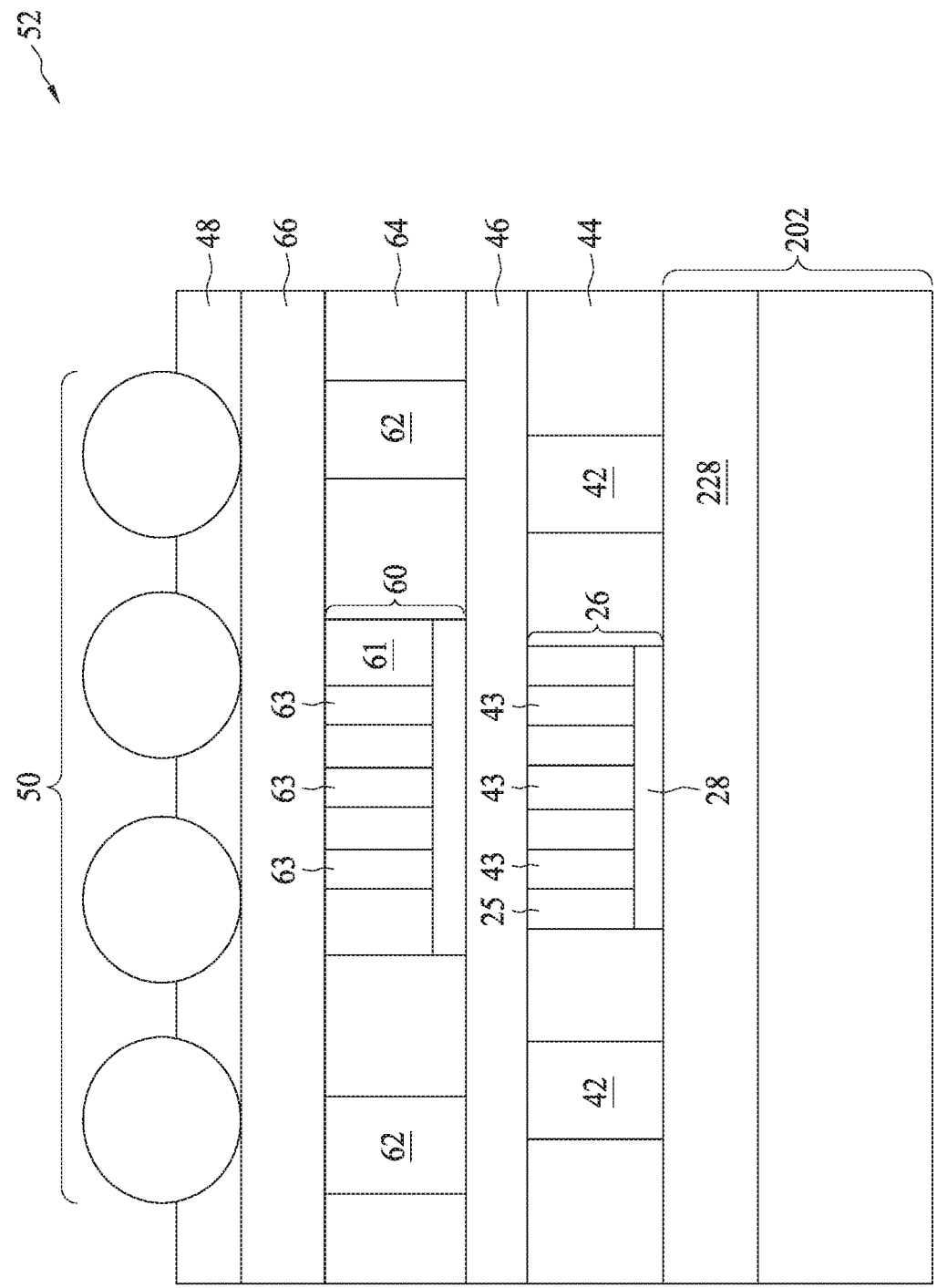

FIG. 38 illustrates a package similar to the package in FIG. 36, wherein through-vias 43 are formed in semiconductor substrate 25 of device die 26. FIG. 39 illustrates a package similar to the package in FIG. 37, wherein through-vias 43 are formed in semiconductor substrate 25 in device die 26, and through-vias 63 are formed in semiconductor substrate 61 in device die 60.

Figure 40:
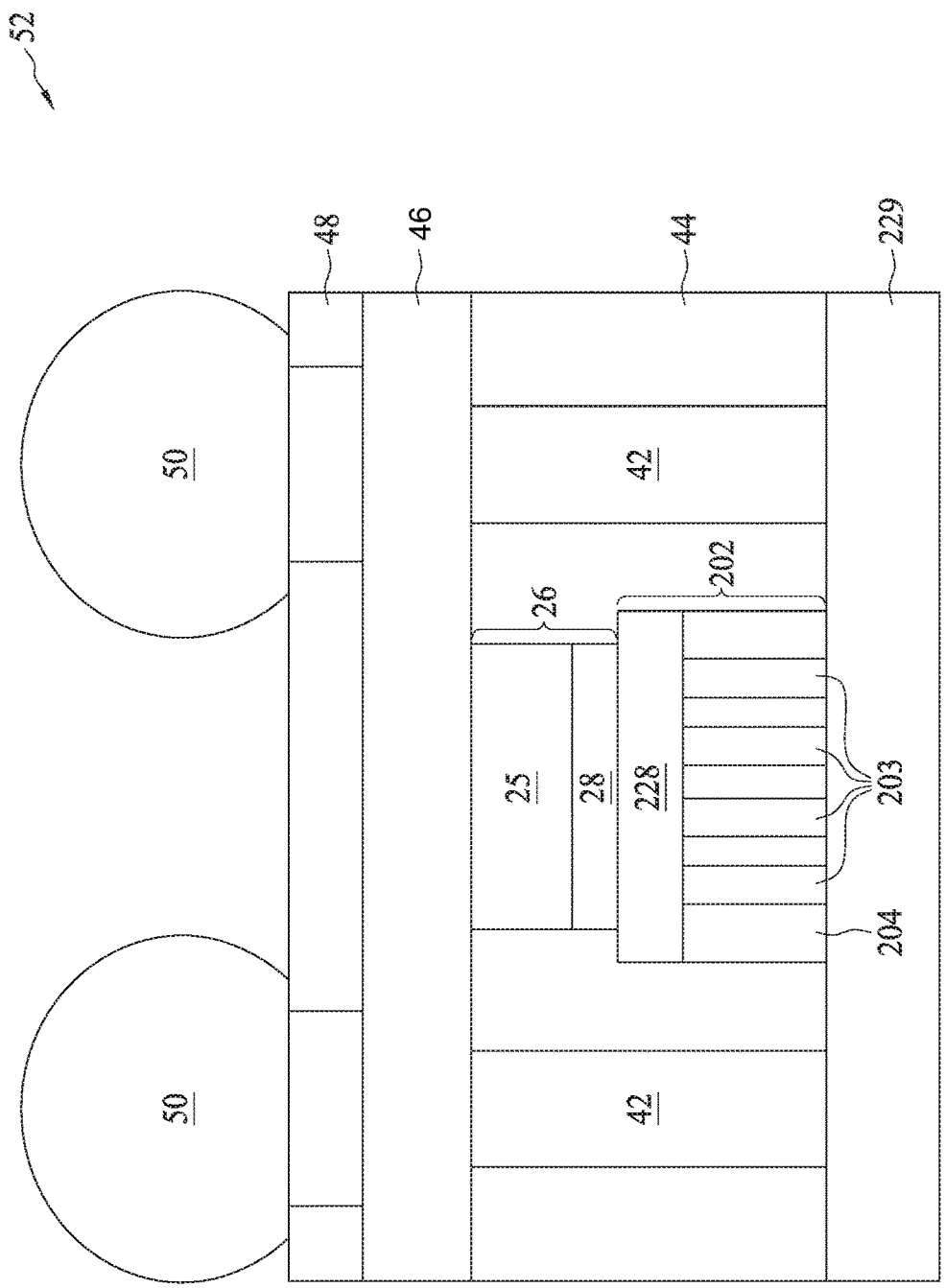
Figure 41:
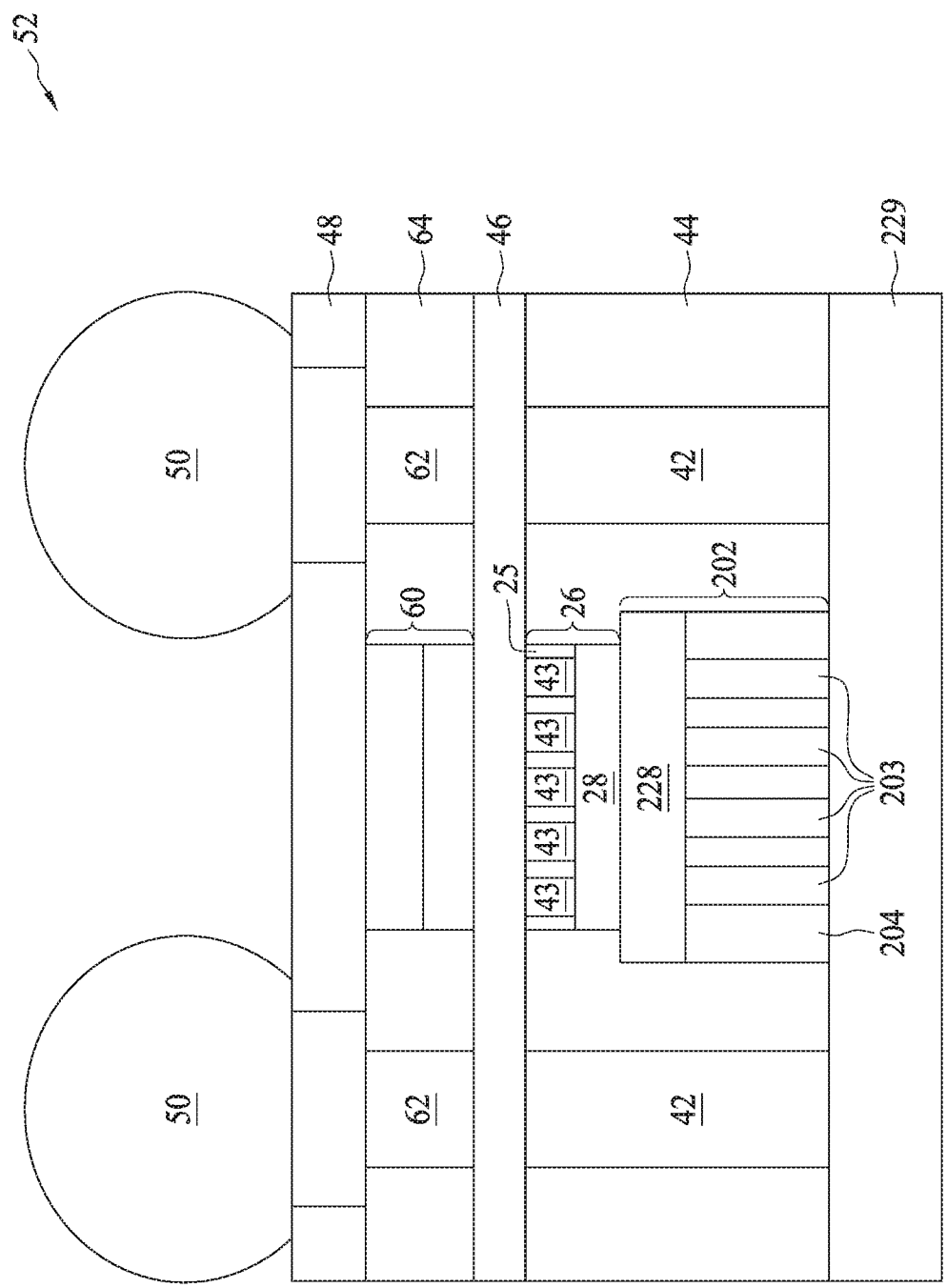

FIG. 40 illustrates a package similar to the package shown in FIG. 26, except device die 202 includes through-vias 203 in semiconductor substrate 204. Through-vias 203 electrically inter-couple the conductive features in interconnect structures 28 and 229. FIG. 41 illustrates a package similar to the package shown in FIG. 40, wherein through-vias 43 are further formed in semiconductor substrate 25 in device die 26.

Figure 42:
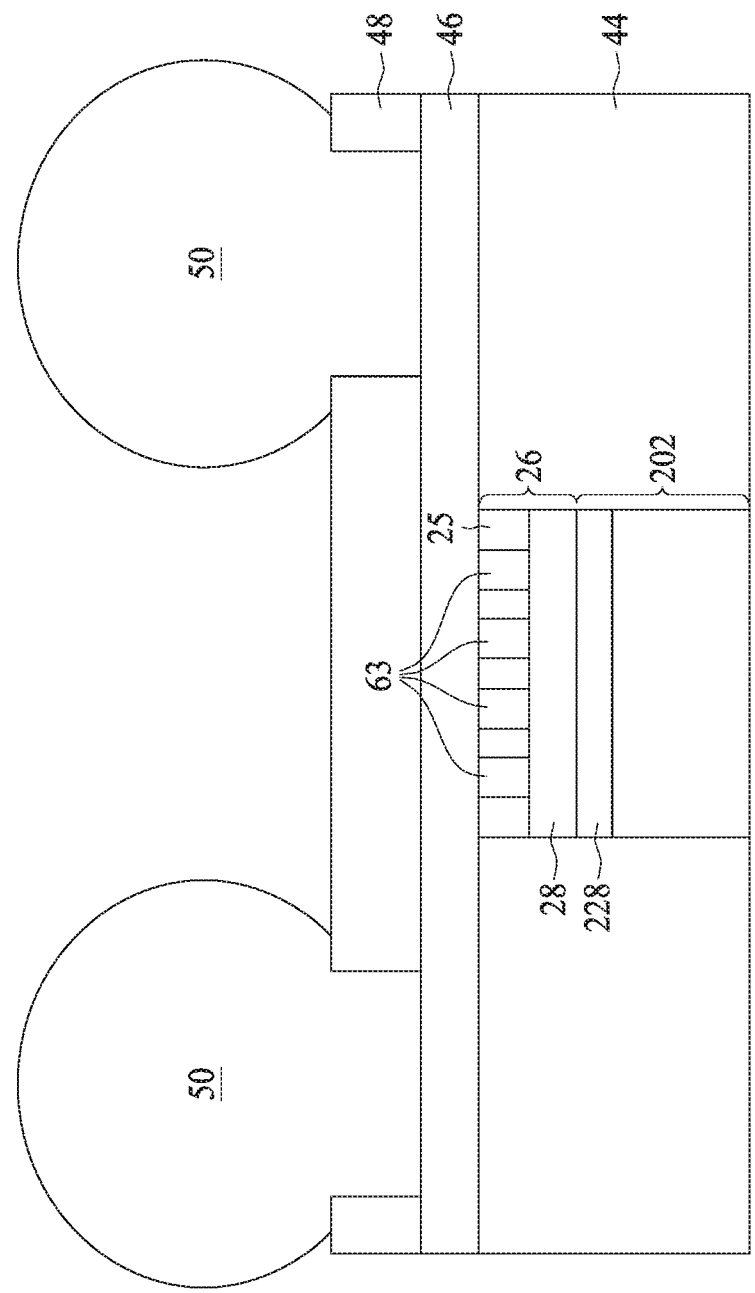
Figure 43:
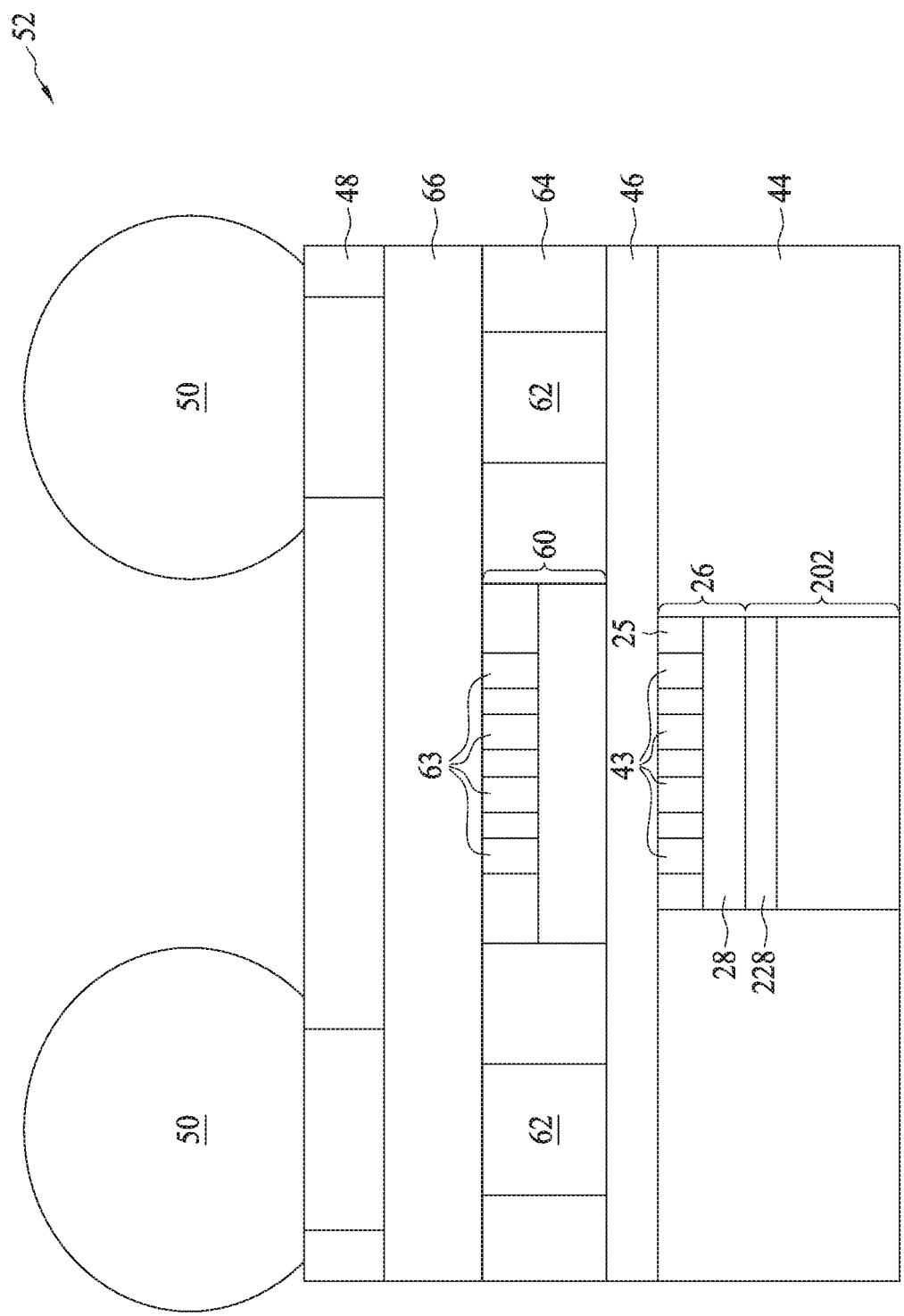

FIG. 42 illustrates a package similar to the package shown in FIG. 26, wherein through-vias 43 are further formed in semiconductor substrate 25 in device die 26, and no through-via is formed in encapsulating material 44. FIG. 43 illustrates a package similar to the package shown in FIG. 42, wherein device die 60, through-vias 62, and encapsulating material 64 are formed. Furthermore, through-vias 63 are formed in device die 60.

FIGS. 45 through 47 illustrate several hybrid bonding schemes in accordance with some embodiments of the present disclosure. Referring to FIG. 45, dielectric liners 40 and 240 are formed to encircle bond pads 36 and 236, respectively. With dielectric liners 40 and 240, even if misalignment occurs, and bond pads 36 contact dielectric liners 240, liners 240 will prevent the diffusion of copper from bond pads 36 into surface dielectric layer 238. Similar, when misalignment occurs, and bond pads 236 contact dielectric liners 40, liners 40 will prevent the diffusion of copper from bond pads 236 into surface dielectric layer 38.

In FIGS. 46 and 47, air gaps 68 and 70 are formed. Air gaps 68 have dishing shapes, which may be generated by adjusting the planarization process for planarizing the top surfaces of device dies 26 and/or 202. Air gaps 70 may be formed by using lithography processes to etch liners 40 and/or 240. Since copper is not able to diffuse through air gaps, air gaps 68 and 70 also have the function of preventing undesirable copper diffusion when misalignment occurs.

The embodiments of the present disclosure have some advantageous features. By forming composite wafers and then performing hybrid bonding using composite wafers, the throughput of the bonding process is improved. On the other hand, using the composite wafers allows device dies having different sizes to be bonded together using hybrid bonding. In addition, by forming composite wafers rather than using the unsawed wafers, known-good-dies may be selected, and defective dies will not be packaged to cause waste.

In accordance with some embodiments of the present disclosure, a method includes placing a first plurality of device dies over a first carrier, with the first plurality of device dies and the first carrier in combination forming a first composite wafer. The first composite wafer is bonded to a second wafer, and the first plurality of device dies is bonded to a second plurality of device dies in the second wafer through hybrid bonding. The method further includes de-bonding the first carrier from the first plurality of device dies, encapsulating the first plurality of device dies in an encapsulating material, and forming an interconnect structure over the first plurality of device dies and the encapsulating material.

In accordance with some embodiments of the present disclosure, a method includes placing a first plurality of device dies over a carrier, forming a plurality of through-vias on a second plurality of device dies of a wafer, aligning the first plurality of device dies on the carrier to the second plurality of device dies, and bonding the first plurality of device dies to the second plurality of device dies through hybrid bonding. The plurality of through-vias extends into spaces between the first plurality of device dies. The method further includes de-bonding the carrier from the first plurality of device dies, encapsulating the first plurality of device dies in an encapsulating material, performing a planarization to level top surfaces of the first plurality of device dies, the encapsulating material, and the plurality of through-vias, and forming an interconnect structure over the first plurality of device dies and the encapsulating material.

In accordance with some embodiments of the present disclosure, a package includes a first device die, a second device die over and bonded to the first device die through hybrid bonding, an encapsulating material encapsulating both the first device die and the second device die therein, and an interconnect structure over the second device die. The interconnect structure extends beyond edges of both the first device die and the second device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    placing a first plurality of device dies over a first carrier, with the first plurality of device dies and the first carrier in combination forming a first composite wafer;
    bonding the first composite wafer to a second wafer, wherein the first plurality of device dies is bonded to a second plurality of device dies in the second wafer through hybrid bonding, wherein after the bonding, the first plurality of device dies is located between the first carrier and the second wafer;
    de-bonding the first carrier from the first plurality of device dies;
    encapsulating the first plurality of device dies in an encapsulating material; and
    forming an interconnect structure over the first plurality of device dies and the encapsulating material.

2. The method of claim 1, wherein during the bonding, empty spaces exist between the first plurality of device dies, and the method further comprises forming a plurality of through-vias on the second wafer before bonding the first composite wafer to the second wafer, and in the bonding the first composite wafer to the second wafer, the plurality of through-vias extends into the empty spaces.

3. The method of claim 2, wherein when the bonding is performed, the plurality of through-vias is spaced apart from the first composite wafer.

4. The method of claim 1 further comprising:
    forming a plurality of through-vias on the first composite wafer, wherein the encapsulating the first plurality of device dies is performed on the first composite wafer, and in the bonding, the encapsulating material contacts, and is not bonded to, the second plurality of device dies.

5. The method of claim 1 further comprising forming the second wafer comprising:
    placing a second plurality of device dies over a second carrier, with the second plurality of device dies and the second carrier in combination forming the second wafer that is a second composite wafer, and the encapsulating material encircles both the first plurality of device dies and the second plurality of device dies.

6. The method of claim 1, wherein the hybrid bonding comprises:
bonding first bond pads of the first plurality of device dies to second bond pads of the second plurality of device dies; and
bonding first surface dielectric layers of the first plurality of device dies to second surface dielectric layers of the second plurality of device dies, and the method further comprises forming air gaps surrounding the first bond pads.

7. The method of claim 1, wherein each of the first plurality of device dies comprises:
a semiconductor substrate; and
additional through-vias penetrating through the semiconductor substrate, wherein the encapsulating the first plurality of device dies comprises a planarization step to thin the first plurality of device dies and to expose the additional through-vias.

8. A method comprising:
placing a first plurality of device dies over a carrier, wherein before being placed on the carrier, the first plurality of device dies is discrete dies separated from each other;
forming a plurality of through-vias on a second plurality of device dies of a wafer;
aligning the first plurality of device dies on the carrier to the second plurality of device dies;
bonding the first plurality of device dies to the second plurality of device dies through hybrid bonding, wherein the plurality of through-vias extends into spaces between the first plurality of device dies;
de-bonding the carrier from the first plurality of device dies;
encapsulating the first plurality of device dies in an encapsulating material;
performing a planarization to level top surfaces of the first plurality of device dies, the encapsulating material, and the plurality of through-vias; and
forming an interconnect structure over the first plurality of device dies and the encapsulating material.

9. The method of claim 8, wherein the hybrid bonding comprises:
pre-bonding the first plurality of device dies to the second plurality of device dies; and
annealing the first plurality of device dies and the second plurality of device dies to form the hybrid bonding.

10. The method of claim 9, wherein the annealing is performed on both the first plurality of device dies and the carrier.

11. The method of claim 9, wherein the annealing is performed with top surfaces of the first plurality of device dies exposed.

12. The method of claim 8, wherein after the planarization, the plurality of through-vias is exposed.

13. The method of claim 8, wherein the aligning is performed by aligning alignment marks to the plurality of through-vias, wherein the alignment marks are attached to the carrier.

14. The method of claim 13, wherein each of the alignment marks overlaps one of the plurality of through-vias.

15. A method comprising:
bonding a first wafer to a second wafer, wherein a first plurality of device dies in the first wafer are bonded to a second plurality of device dies in the second wafer through hybrid bonding, and portions of the first wafer are inserted into spaces between portions of the second wafer;
encapsulating the first plurality of device dies in an encapsulating material, wherein the encapsulating material further encapsulates a plurality of conductive posts of the second plurality of device dies;
performing a Chemical Mechanical Polish (CMP) to reveal the first plurality of device dies and the plurality of conductive posts; and
forming redistribution lines over the first plurality of device dies, wherein the redistribution lines are electrically connected to the plurality of conductive posts.

16. The method of claim 15, wherein the hybrid bonding comprises:
pre-bonding the first plurality of device dies to the second plurality of device dies;
separating the first wafer into pieces; and
annealing the first plurality of device dies and the second plurality of device dies to form hybrid bonds, wherein the annealing is performed before the first wafer is separated into individual pieces.

17. The method of claim 15, wherein the hybrid bonding comprises:
pre-bonding the first plurality of device dies to the second plurality of device dies;
separating the first wafer into pieces; and
annealing the first plurality of device dies and the second plurality of device dies to form the hybrid bonding, wherein the annealing is performed with top surfaces of the first plurality of device dies revealed.

18. The method of claim 15 further comprising aligning the first wafer to the second wafer by aligning alignment marks in the first wafer to the plurality of conductive posts of the second wafer.

19. The method of claim 18, wherein each of the alignment marks overlaps one of the plurality of conductive posts.

20. The method of claim 15 further comprising attaching the first plurality of device dies to a carrier to form the first wafer.

* * * * *